United States Patent
Bouche et al.

(10) Patent No.: US 11,916,010 B2
(45) Date of Patent: Feb. 27, 2024

(54) BACK END OF LINE INTEGRATION FOR SELF-ALIGNED VIAS

(71) Applicant: Intel Corporation, Santa Clara, CA (US)

(72) Inventors: Guillaume Bouche, Portland, OR (US); Andy Chih-Hung Wei, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 16/880,744

(22) Filed: May 21, 2020

(65) Prior Publication Data

US 2021/0366823 A1    Nov. 25, 2021

(51) Int. Cl.
*H01L 23/522* (2006.01)
*H01L 21/311* (2006.01)
(Continued)

(52) U.S. Cl.
CPC .... *H01L 23/5226* (2013.01); *H01L 21/31111* (2013.01); *H01L 21/31144* (2013.01); *H01L 21/76802* (2013.01); *H01L 21/76877* (2013.01); *H01L 21/76897* (2013.01); *H01L 23/5283* (2013.01)

(58) Field of Classification Search
CPC ........... H01L 23/5226; H01L 21/31111; H01L 21/31144; H01L 21/76802; H01L 21/76877; H01L 21/76897; H01L 23/5283; H01L 21/76885; H01L 23/528; H01L 21/76816; H01L 21/76807; H01L 23/13; H01L 23/481; H01L 23/50; H01L 23/525; H01L 24/10; H01L 24/42
See application file for complete search history.

(56) References Cited

U.S. PATENT DOCUMENTS 5,364,493 A    11/1994 Hunter, Jr. et al.
5,582,679 A    12/1996 Lianjun et al.
(Continued)

FOREIGN PATENT DOCUMENTS

WO    0137339 A1    5/2001

OTHER PUBLICATIONS

Hashemi, F., et al, "A New Resist for Area Selective Atomic and Molecular Layer Deposition on Metal-Dielectric Patterns", J. Phys. Chem. C 2014, 118, 19057-10962.
(Continued)

*Primary Examiner* — Karen Kusumakar
(74) *Attorney, Agent, or Firm* — Akona IP

(57) ABSTRACT

Disclosed herein are methods for manufacturing an integrated circuit (IC) structure, e.g., for manufacturing a metallization stack portion of an IC structure, with one or more self-aligned vias integrated in the back end of line (BEOL), and related semiconductor devices. The methods may employ direct metal etch for scaling the BEOL pitches of the metallization layers. In one aspect, an example method results in fabrication of a via that is self-aligned to both a metal line above it and a metal line below it. Methods described herein may provide improvements in terms of one or more of reducing the misalignment between vias and electrically conductive structures connected thereto, reducing the RC delays, and increasing reliability if the final IC structures.

20 Claims, 31 Drawing Sheets

(51) Int. Cl.
*H01L 21/768* (2006.01)
*H01L 23/528* (2006.01)

(56) References Cited

U.S. PATENT DOCUMENTS

| | | | |
|---|---|---|---|
| 6,352,917 B1 | 3/2002 | Gupta et al. | |
| 6,413,872 B1 | 7/2002 | Kitch | |
| 9,922,929 B1 | 3/2018 | Zhang et al. | |
| 2002/0155693 A1 | 10/2002 | Hong et al. | |
| 2009/0251944 A1* | 10/2009 | Happ | H10N 70/8833 216/13 |
| 2009/0261313 A1* | 10/2009 | Lung | H10N 70/8413 257/E21.477 |
| 2012/0086128 A1 | 4/2012 | Ponoth et al. | |
| 2013/0168867 A1 | 7/2013 | Shim | |
| 2014/0225261 A1 | 8/2014 | Lee et al. | |
| 2016/0049332 A1 | 2/2016 | Xie et al. | |
| 2018/0261497 A1 | 9/2018 | Drissi et al. | |
| 2018/0261544 A1 | 9/2018 | Kim et al. | |
| 2019/0067102 A1 | 2/2019 | Zhang et al. | |
| 2019/0067194 A1 | 2/2019 | Yu et al. | |
| 2019/0080960 A1 | 3/2019 | Ho et al. | |
| 2019/0181088 A1 | 6/2019 | Lee et al. | |
| 2021/0050259 A1 | 2/2021 | Xie et al. | |

OTHER PUBLICATIONS

Love, C et al., "Self-Assembled Monolayers of Thiolates on Metals as a Form of Nanotechnology", Chem. Rev. 2005, 105, 1103-1169.
Semple, D., et al "Area-Selective Atomic Layer Deposition Assisted by Self-Assembled Monolayers: A Comparison of C, Co, W, and Ru", Chem. MAter, 2019, 31, 1635-1645.
Extended European Search Report from European Application No. 20212636.5 dated Jul. 18, 2022, 9 pages.
Extended European Search Report from European Application No. 22150660.3 dated Jun. 20, 2022, 8 pages.
EPO Jun. 7, 2021 Extended European Search Report from European Application No. 20212636.5; 9 pages.
Tokei et al., "How To solve teh BEOL RC delay problem?", Semiconductor Digest 2017; y pages retrieved from https://sst.semiconductor-gigest.com/2017/11/how-to-solve-the-beol-rc-delay-problem/ retrieved on May 6, 2020.

* cited by examiner

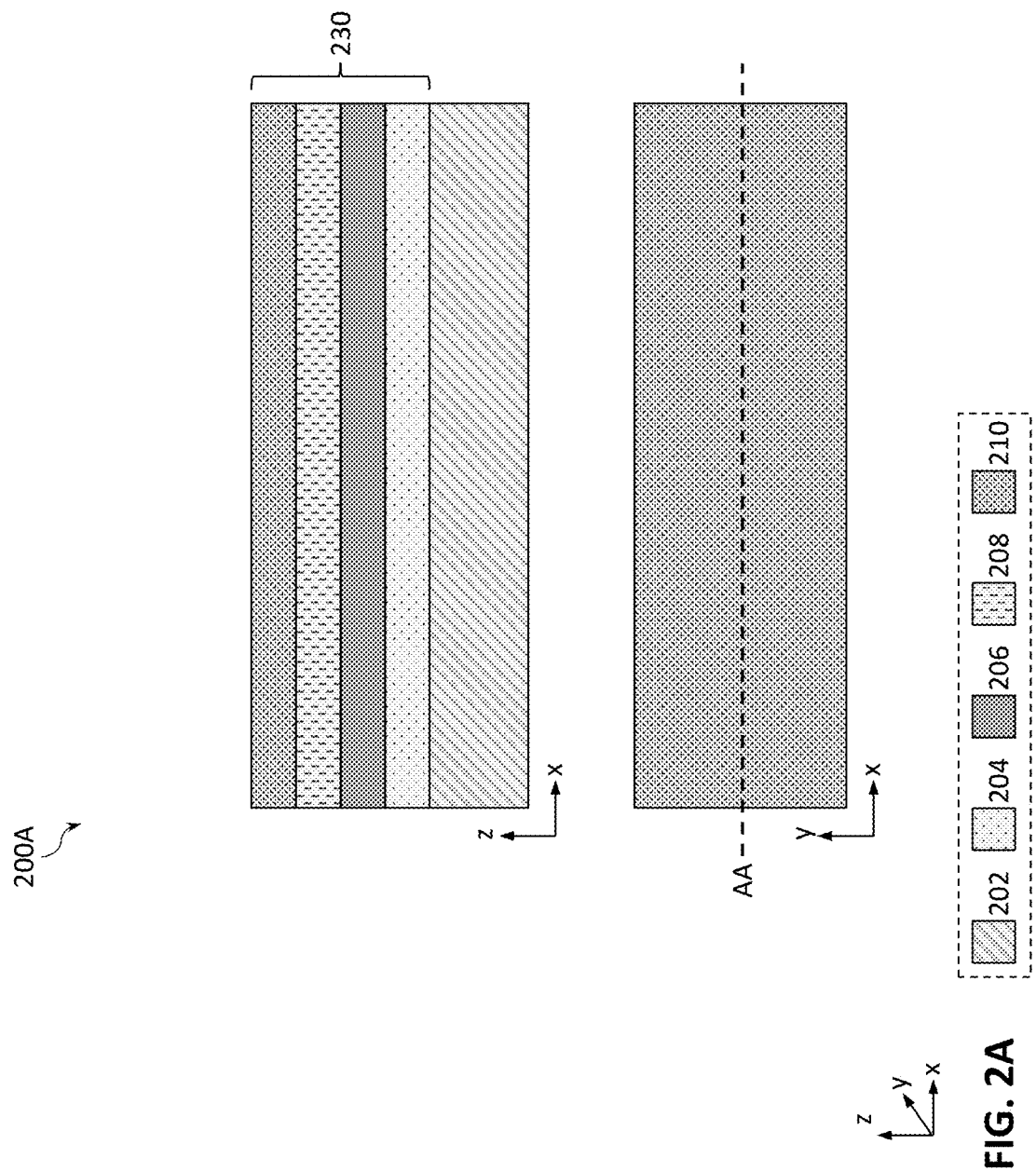

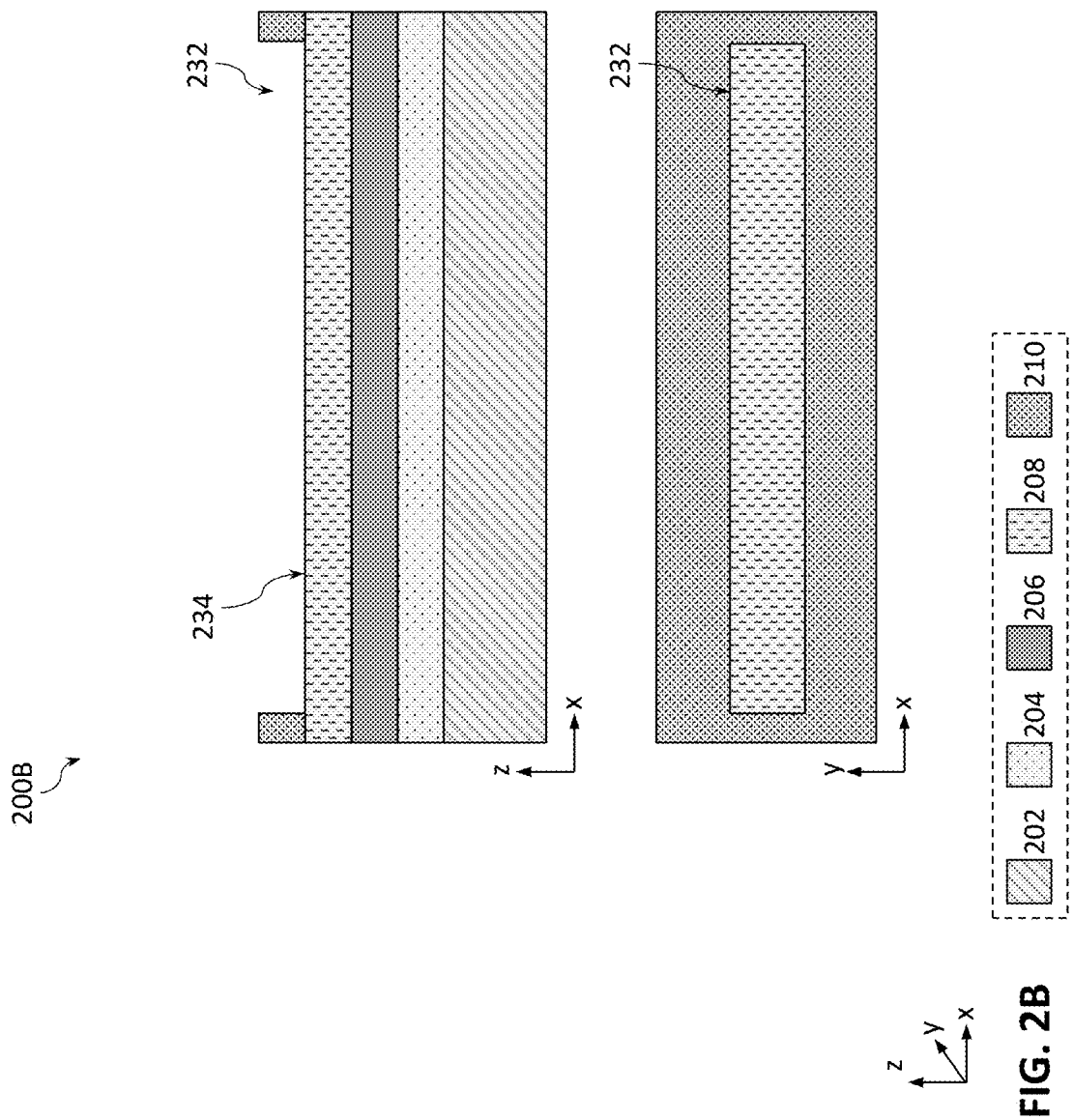

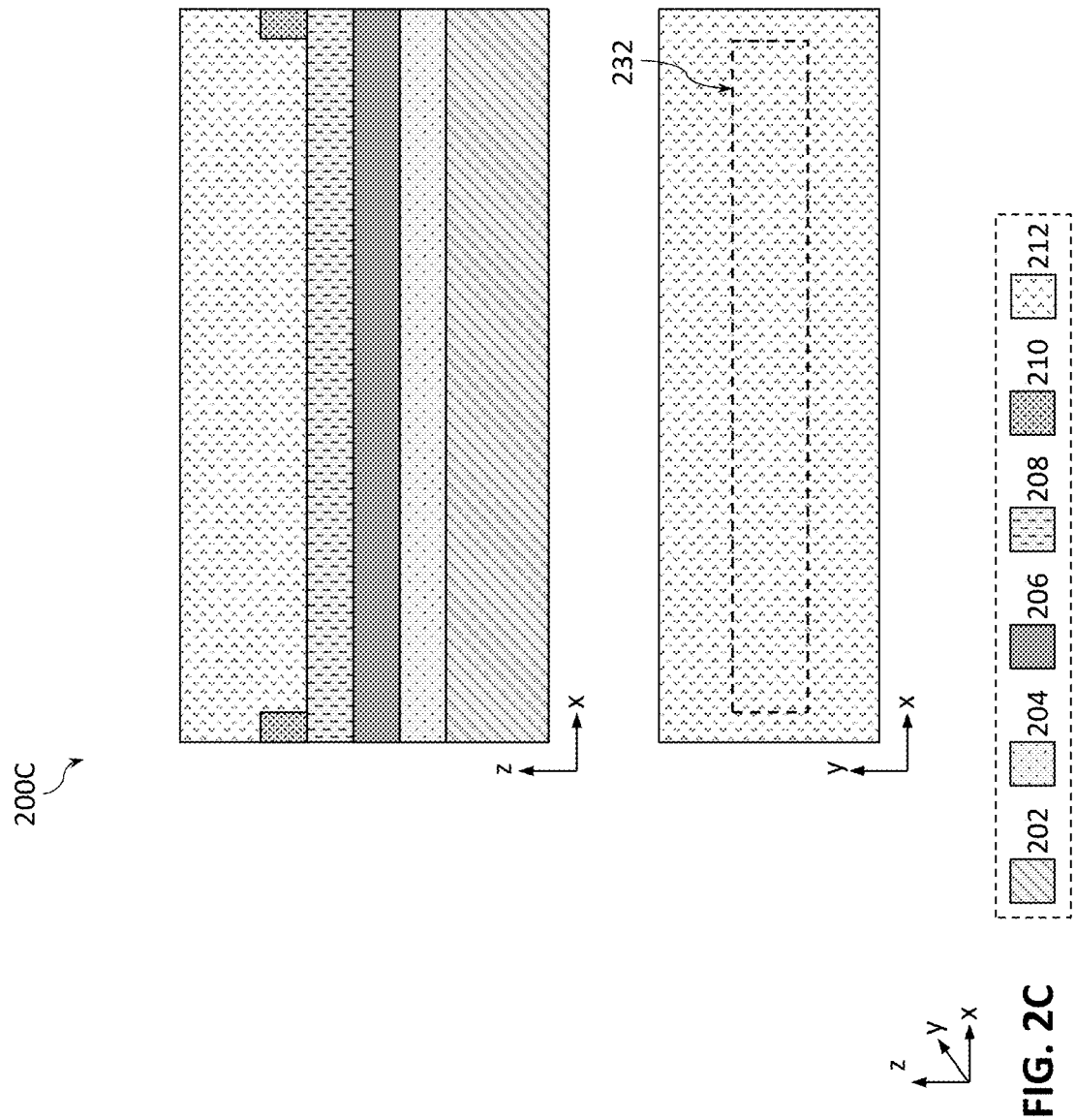

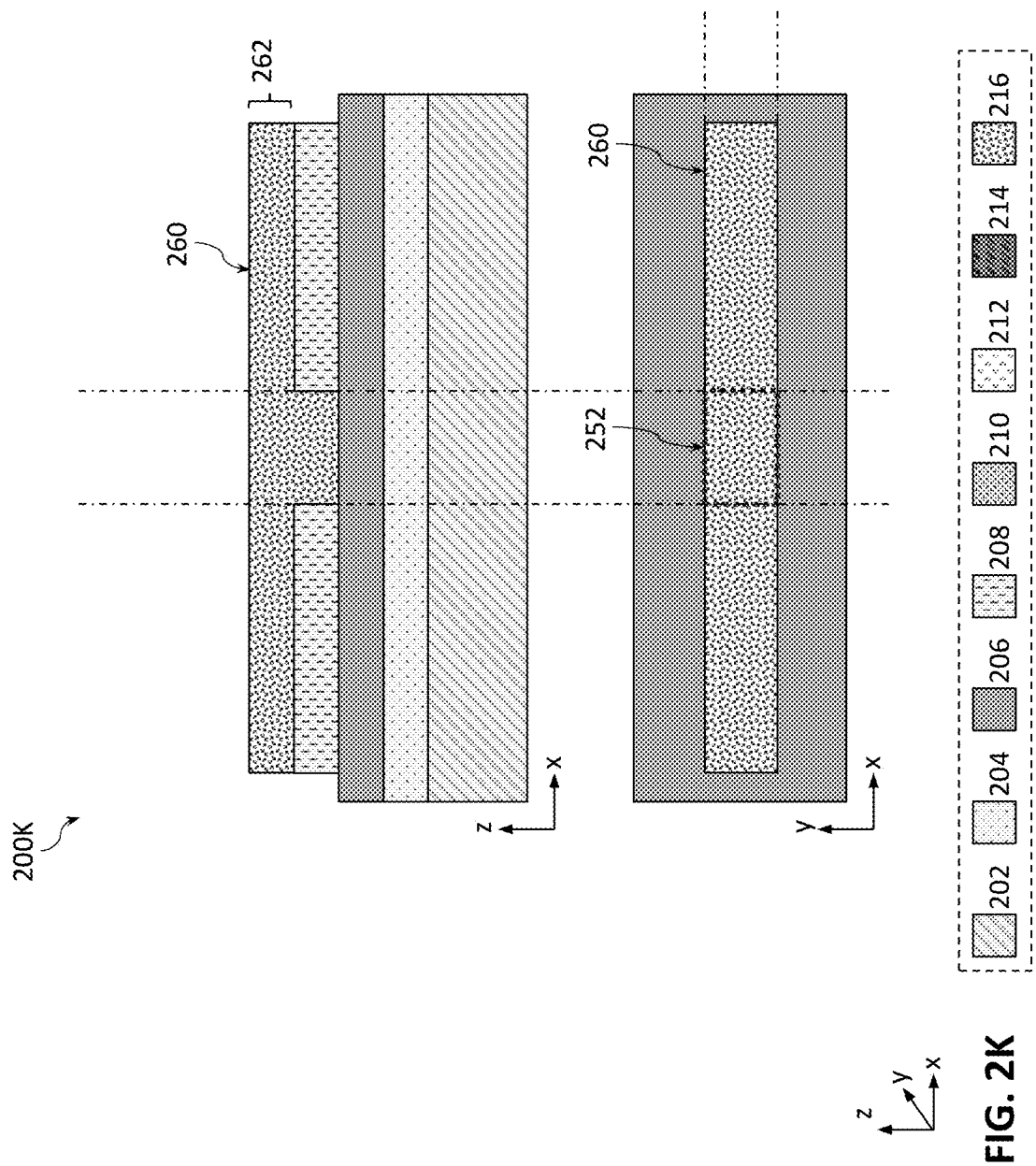

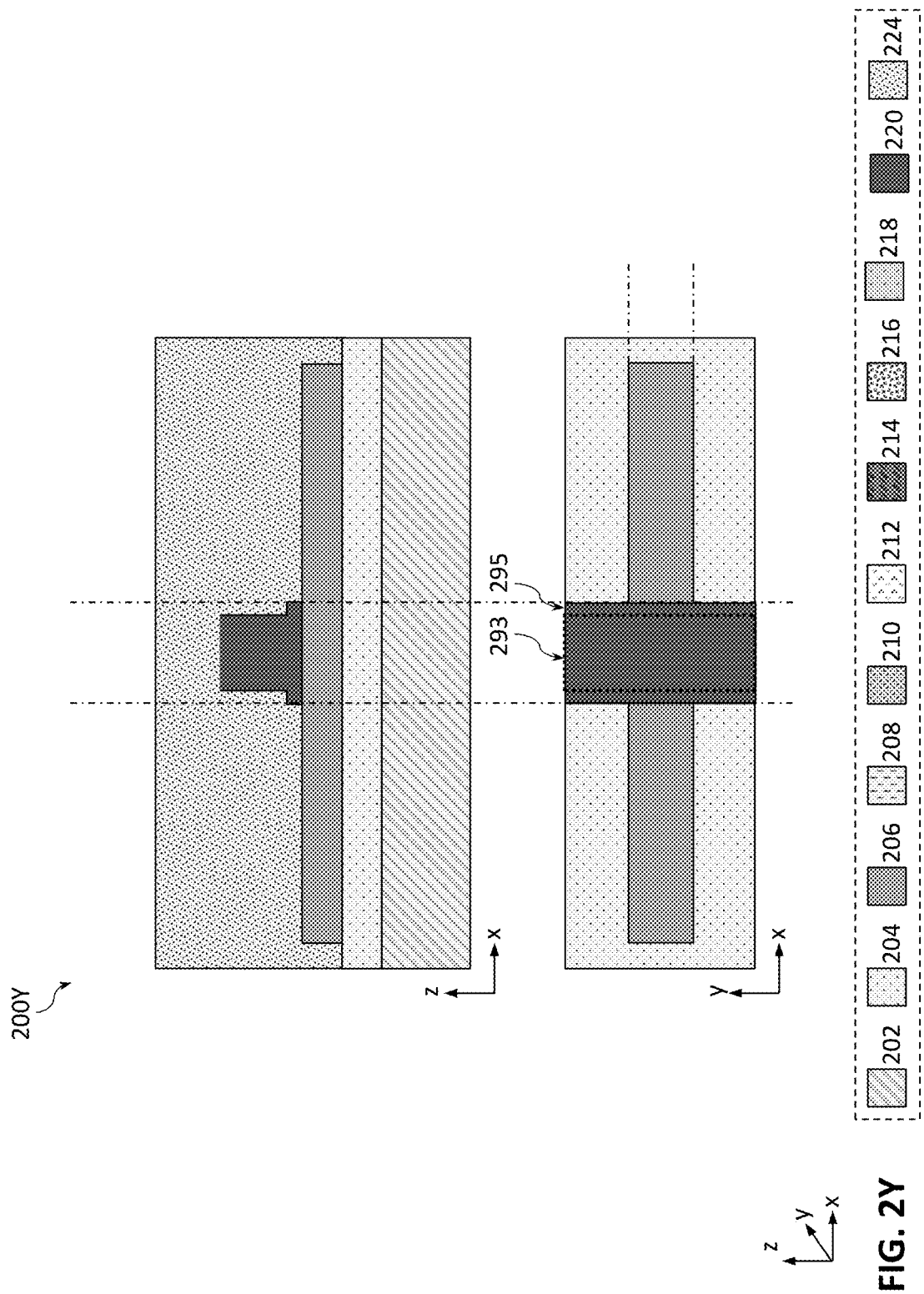

BACK END OF LINE INTEGRATION FOR SELF-ALIGNED VIAS

TECHNICAL FIELD

This disclosure relates generally to the field of semiconductor devices, and more specifically, to back end of line (BEOL) integration of vias.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
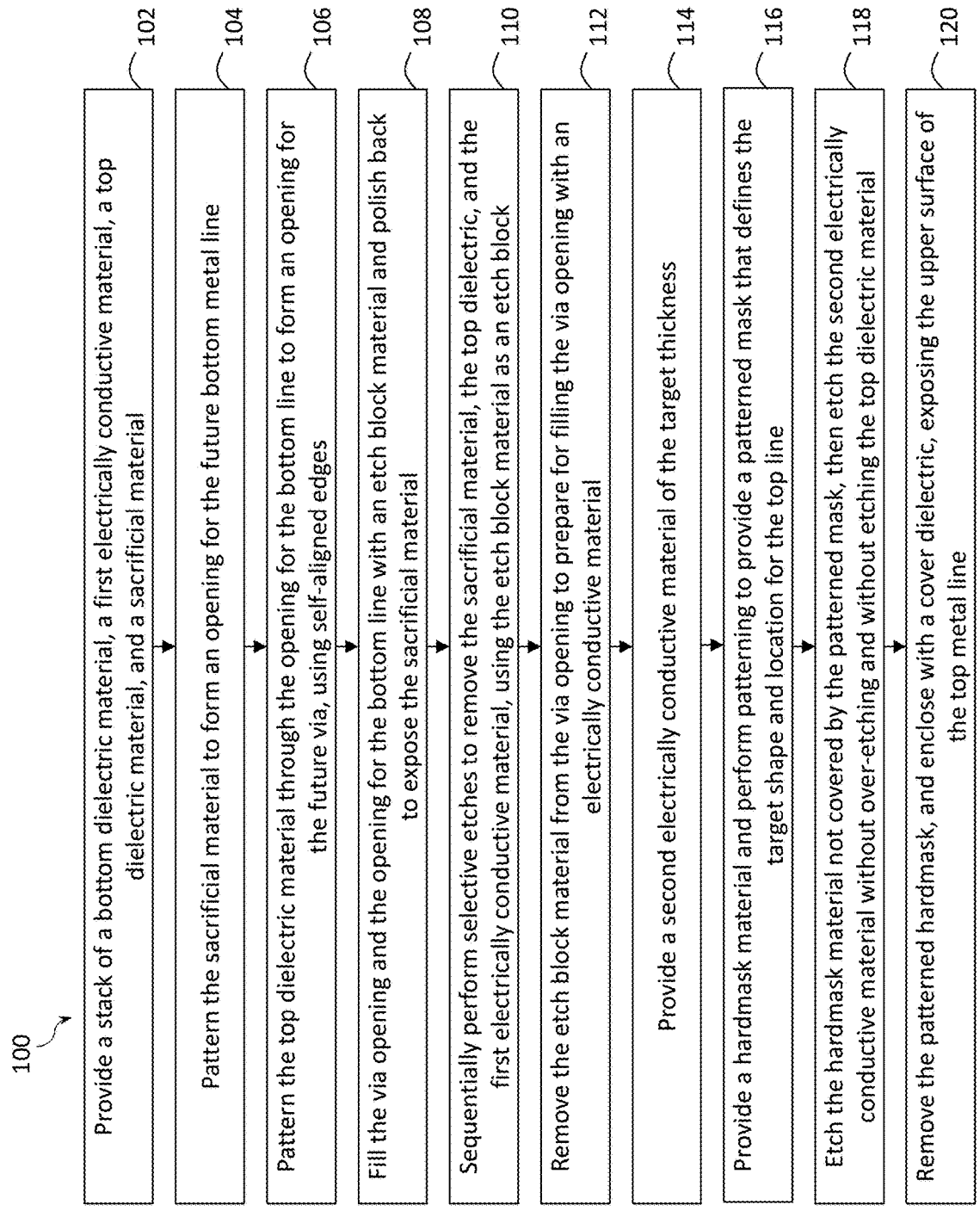
FIG. 1 is a flow diagram of an example method for providing self-aligned vias integrated in the BEOL, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating self-aligned vias integrated in the BEOL, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, which are known in the art as vias, to electrically connect metal lines or other interconnects above the vias to metal lines or other interconnects below the vias. In this context, the term "metallization stack" may be used to describe a stacked series of electrically insulated metallic interconnecting wires that are used to connect together various devices of an IC, where adjacent layers of the stack are linked together through the use of electrical contacts and vias.

Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer, which may be referred to as a via location opening. Next, an opening for the via may be etched in the dielectric layer by using the location opening in the photoresist layer as an etch mask. This opening in the dielectric layer is referred to as a via opening. Finally, the via opening may be filled with one or more metals or other conductive materials to form the via.

In the past, the sizes and the spacing of vias have progressively decreased, and it is expected that in the future the sizes and the spacing of the vias will continue to progressively decrease, for at least some types of ICs (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the underlying electrically conductive structures (e.g., gate and trench contacts) generally need to be controlled to high tolerances on the order of a quarter of the via pitch. Edge placement error margin is a measure of how much misalignment between a via and the underlying electrically conductive structure on which the via was supposed to land may be tolerated.

Misalignment between a via and underlying electrically conductive structures to which the via is supposed to make a contact to is one of the main contributors to BEOL resistance-capacitance (RC) delays and needs to be minimized. In particular, it would be desirable to maximize the area overlap between the bottom of a via and the top of an underlying bottom metal line, as well as to maximize the area overlap between the top of the via and the bottom of a top metal line above the via. As used herein, the term "bottom metal line" refers to any electrically conductive structure that is provided below the via (i.e., so that the bottom metal line is between the via and a support structure over which the devices and interconnects are built) and to which the via is supposed to make an electrical contact to. Similarly, as used herein, the term "top metal line" refers to any electrically conductive structure that is provided above the via (i.e., so that the via is between the support structure and the top metal line) and to which the via is supposed to make an electrical contact to. In various embodiments, such bottom and top metal lines may include electrically conductive structures other than lines/trenches (e.g., the bottom metal line may be a gate contact), and/or may be formed, or include, electrically conductive materials other than metals.

Disclosed herein are methods for manufacturing an IC structure, e.g., for manufacturing a metallization stack portion of an IC structure, with one or more self-aligned vias integrated in the BEOL provided over a support structure (e.g., a substrate, a wafer, or a chip), and related semiconductor devices. The methods may employ direct metal etch for scaling the BEOL pitches of the metallization layers. In one aspect, an example method results in fabrication of a via that is self-aligned to, both, a metal line above it (i.e., the top metal line) and a metal line below it (i.e., the bottom metal line). Methods described herein may provide improvements in terms of one or more of reducing the misalignment between vias and electrically conductive structures connected thereto, reducing the RC delays, and increasing reliability in the final IC structures.

IC structures as described herein, in particular metallization stacks with self-aligned vias integrated in the BEOL as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2Z, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. In another example, a term "interconnect" is used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" is used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" is used to describe an electrically conductive element that interconnects two or more trench contacts of different levels. To that end, vias are provided substantially perpendicularly to the plane of an IC chip. A via may interconnect two trench contacts in adjacent levels or two trench contacts in not adjacent levels. A term "metallization stack" refers to a stack of one or more interconnects for providing connectivity to different circuit components of an IC chip. The terms "substantially," "close," "approximately," "near," and "about," generally refer to being within +/−20% of a target value based on the context of a particular value as described herein or as known in the art.

Example Fabrication Method

FIG. 1 is a flow diagram of an example method 100 for providing self-aligned vias integrated in the BEOL, in accordance with some embodiments.

Although the operations of the method 100 are illustrated once each and in a particular order, the operations may be performed in any suitable order and repeated as desired. For example, one or more operations may be performed in parallel to manufacture, substantially simultaneously, multiple self-aligned vias integrated in the BEOL as described herein. In another example, the operations may be performed in a different order to reflect the structure of a particular device assembly in which one or more self-aligned vias integrated in the BEOL as described herein will be included.

In addition, the example manufacturing method 100 may include other operations not specifically shown in FIG. 1, such as various cleaning or planarization operations as known in the art. For example, in some embodiments, the support structure 102, as well as layers of various other materials subsequently deposited thereon, may be cleaned prior to, after, or during any of the processes of the method 100 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 100 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figure 2D:
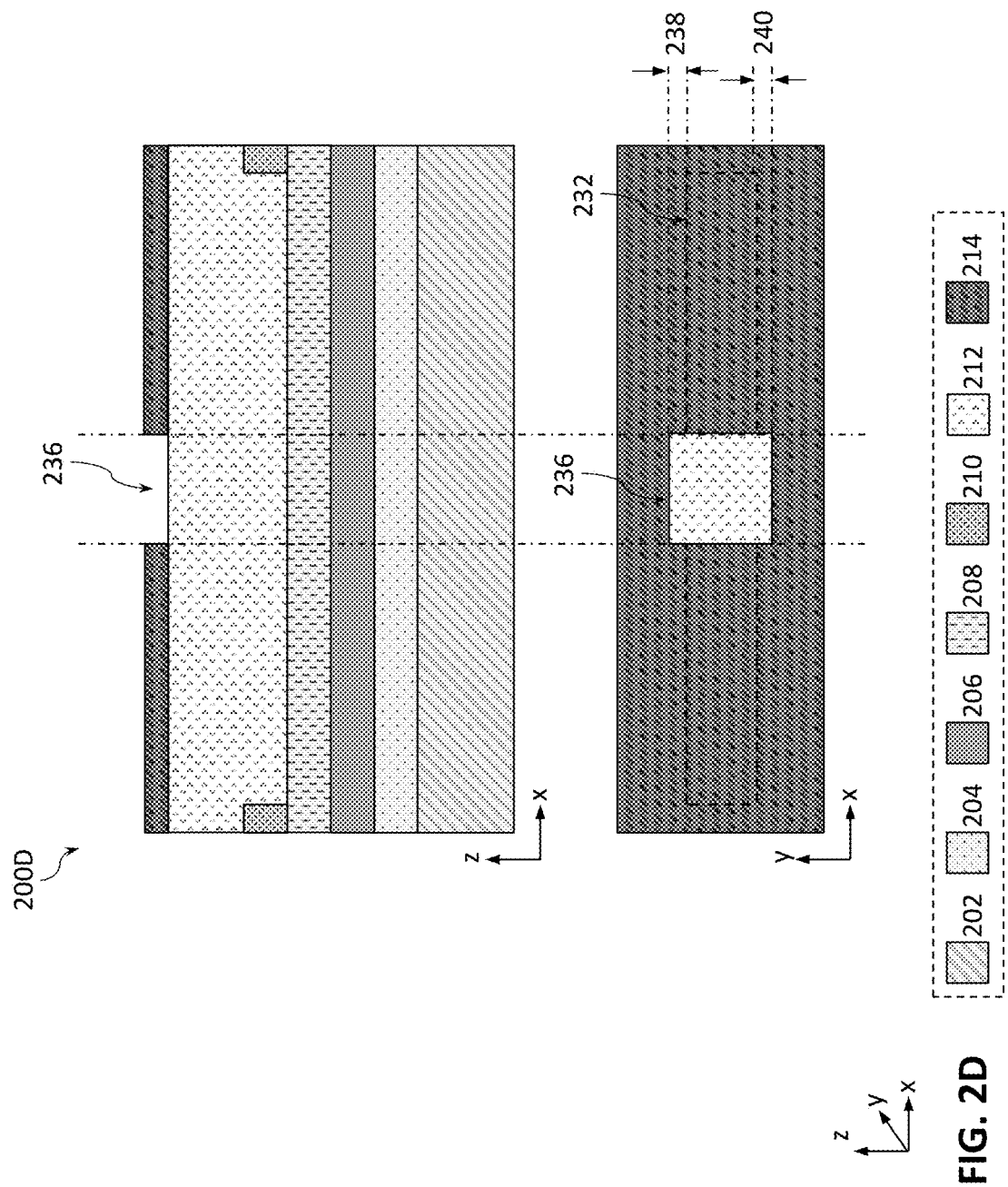
FIGS. 2A-2Z illustrate various stages in the manufacture of an example integrated circuit (IC) structure according to the method of FIG. 1, in accordance with some embodiments.
Figure 2E:
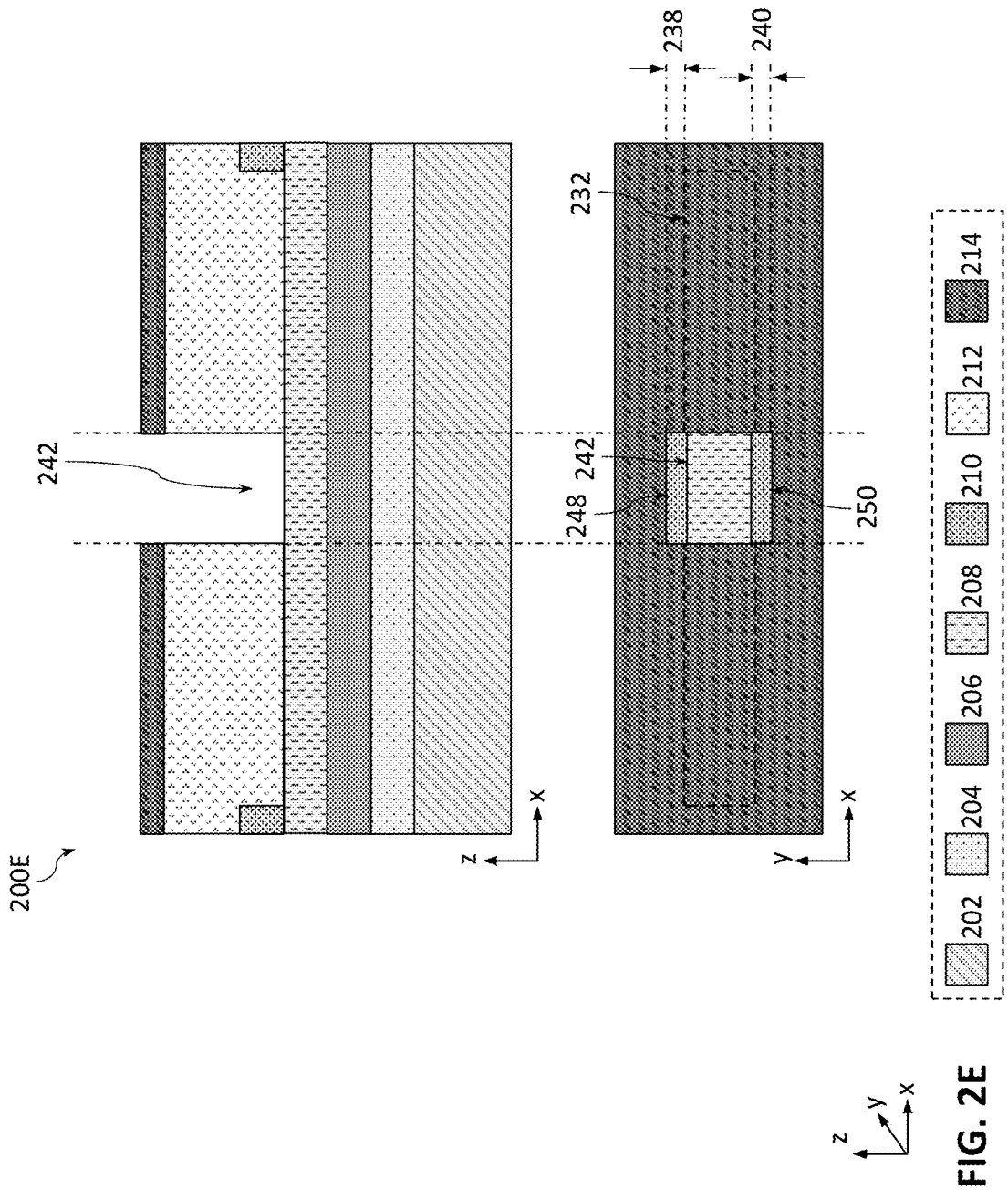
Figure 2F:
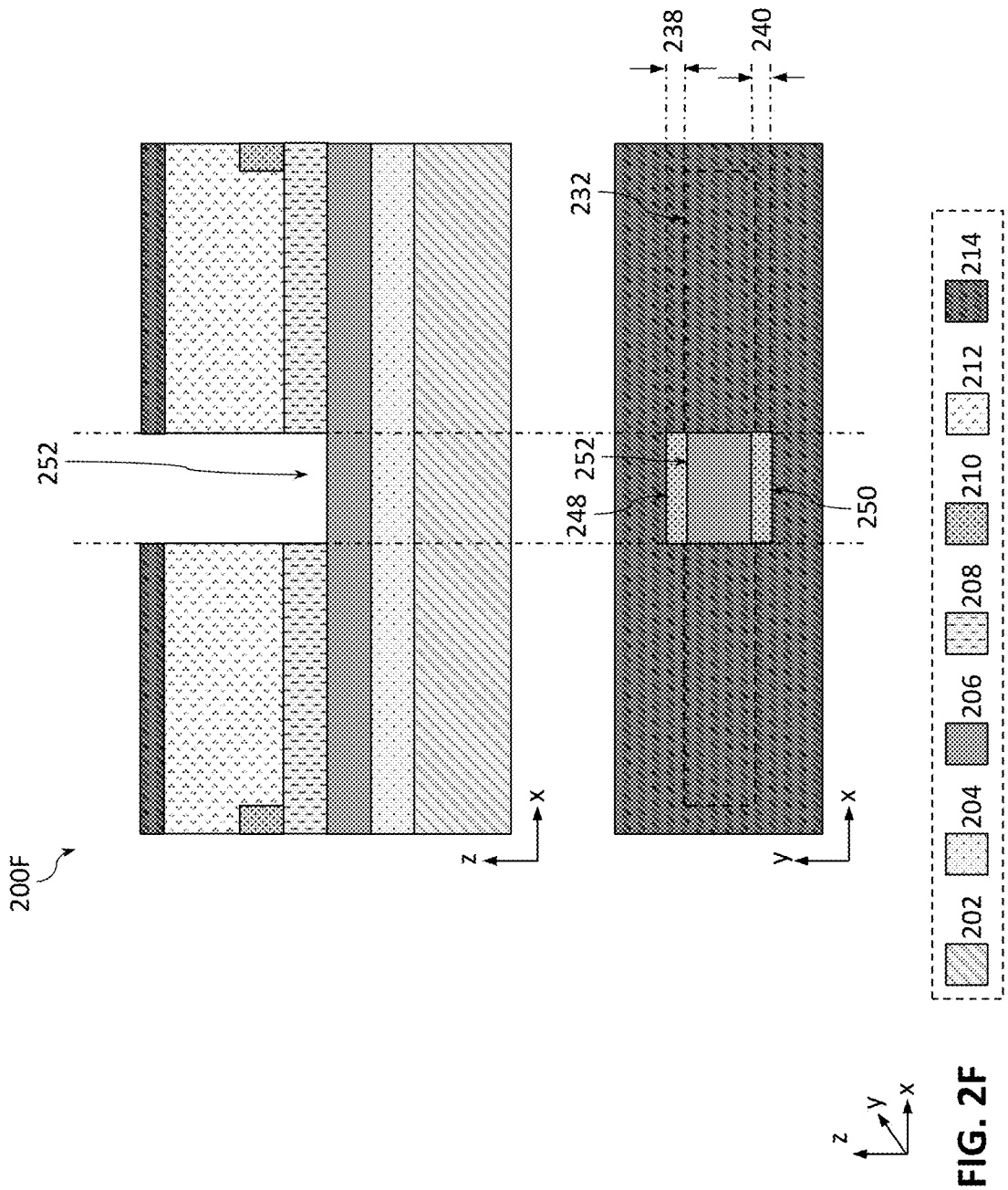
Figure 2G:
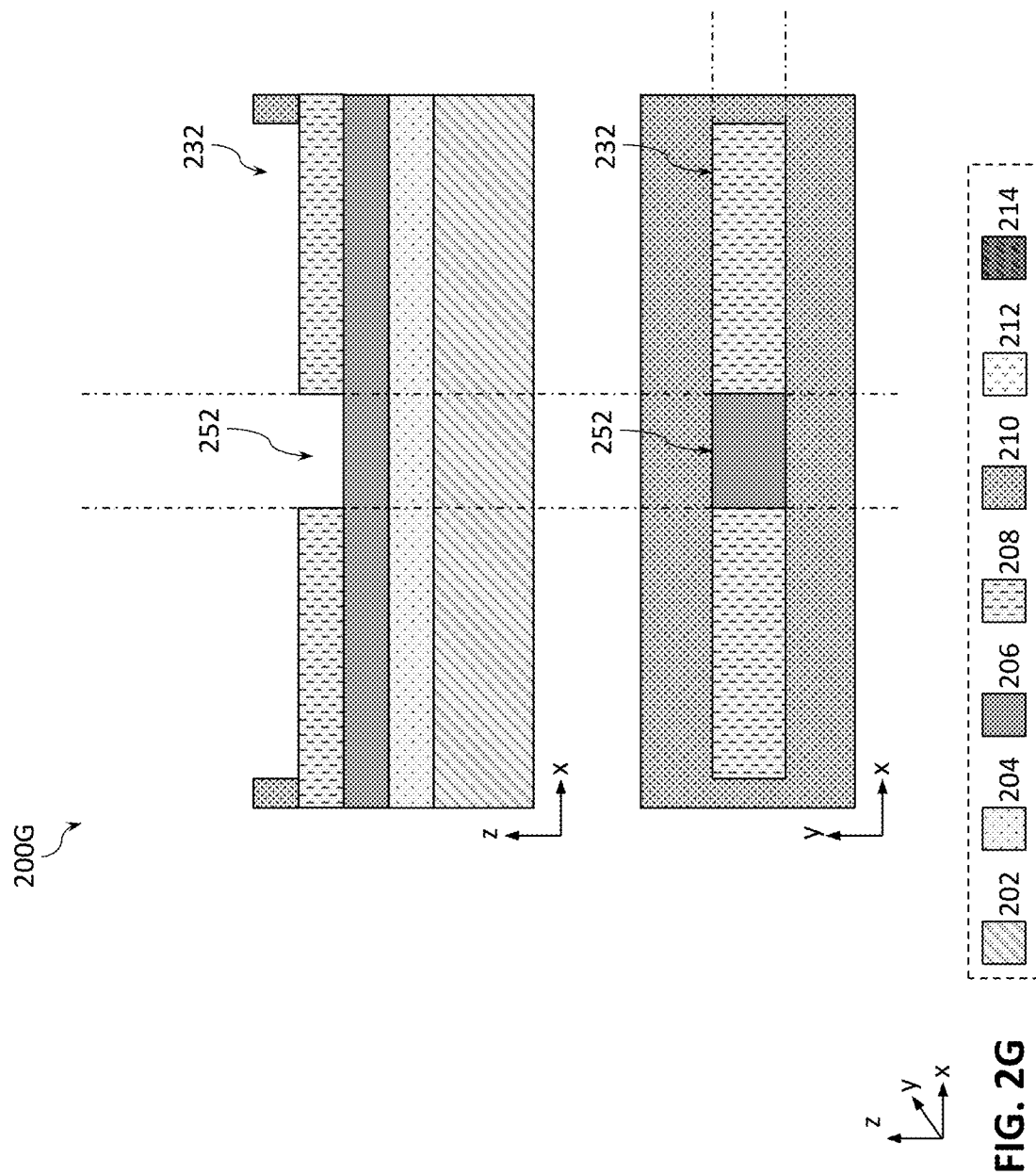
Figure 2H:
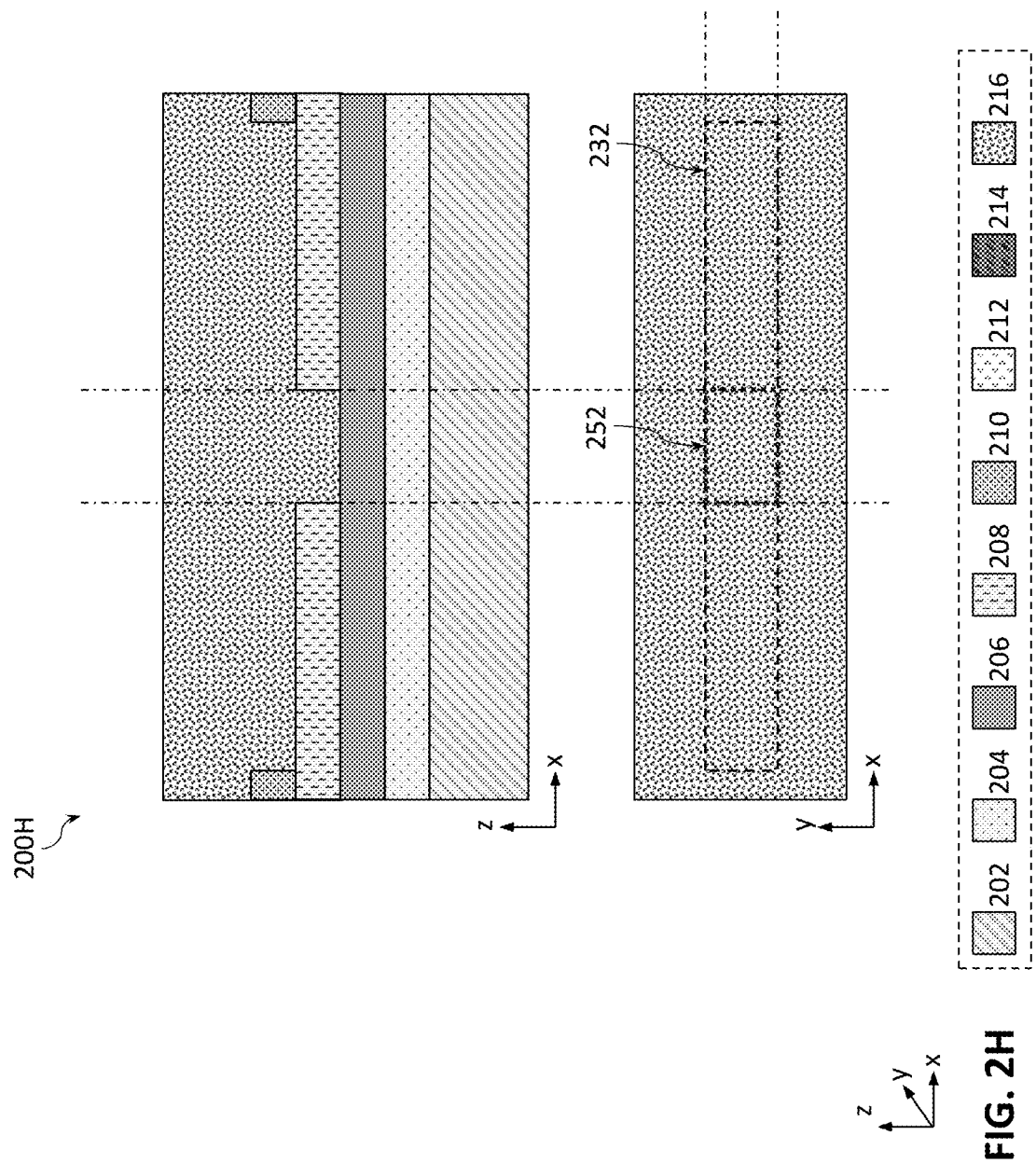
Figure 21:
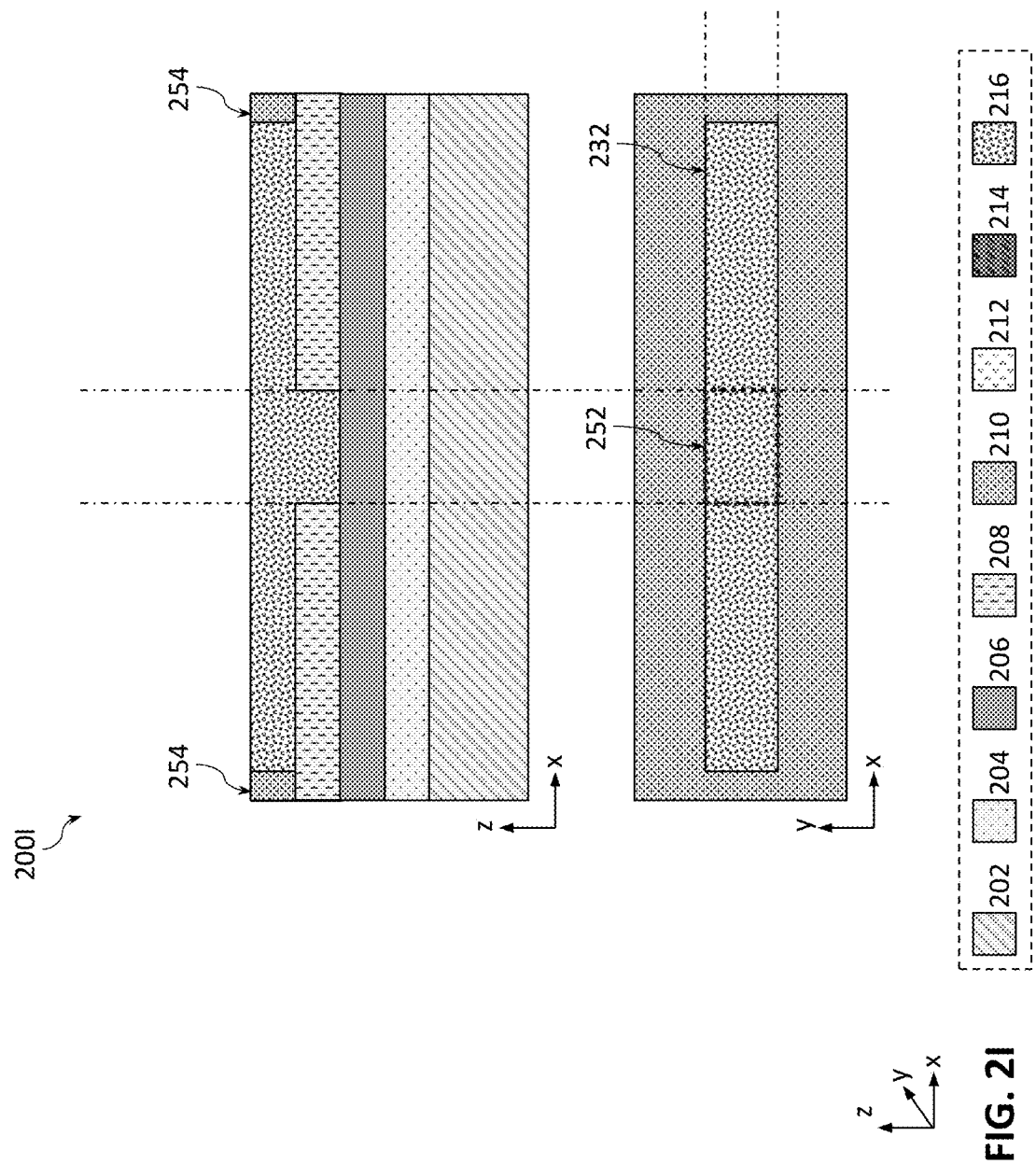
Figure 2J:
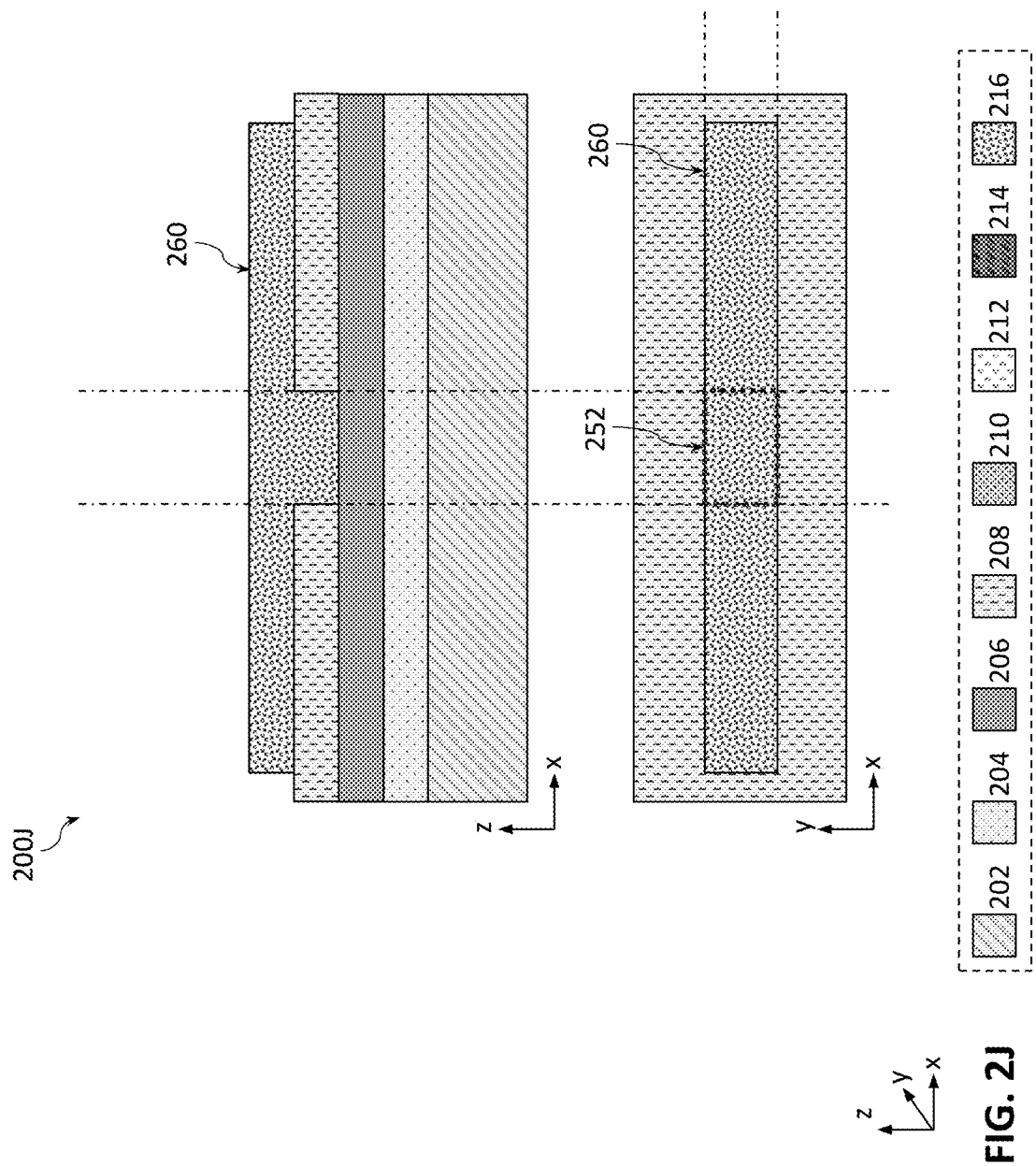
Figure 2L:
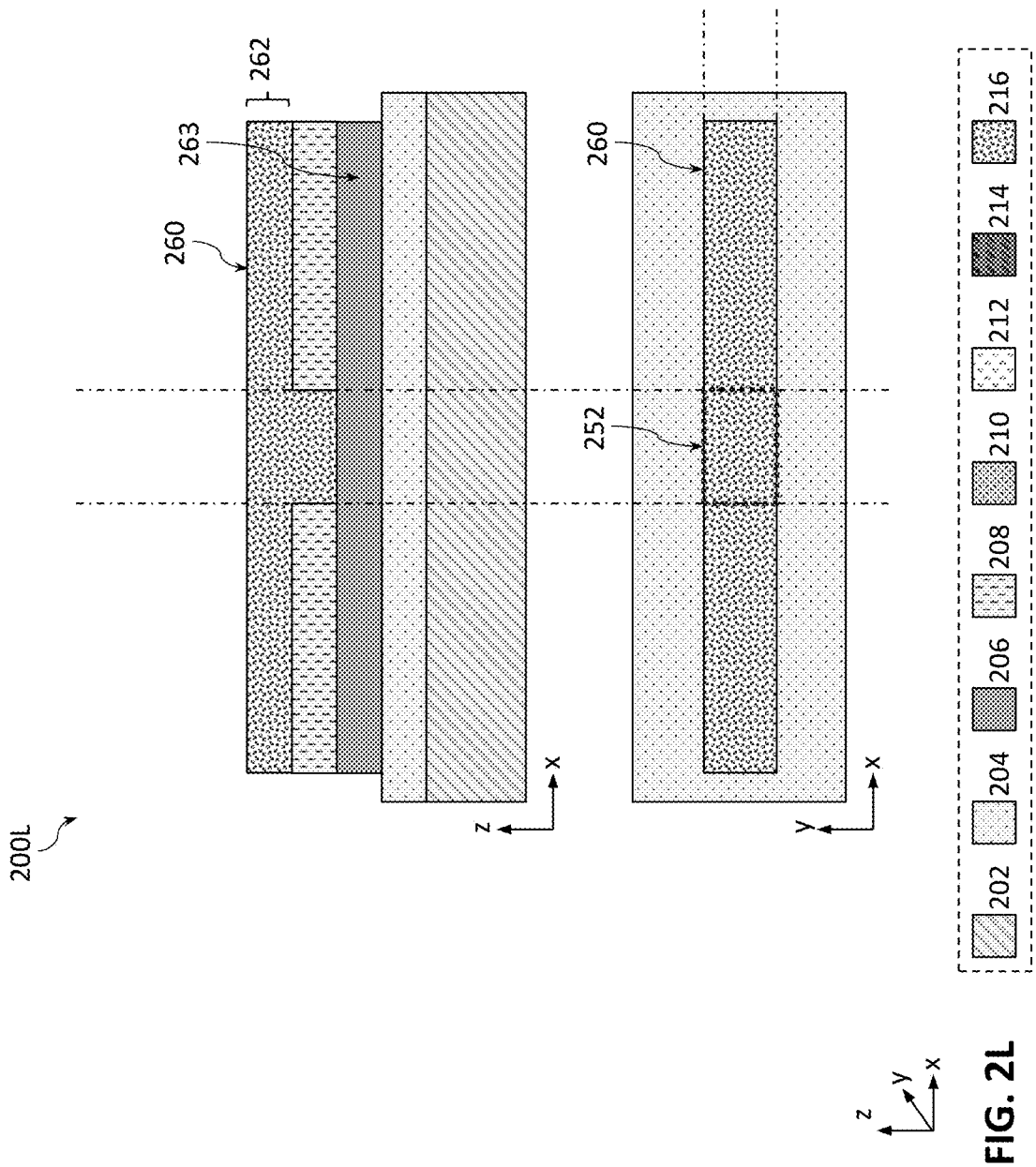
Figure 2M:
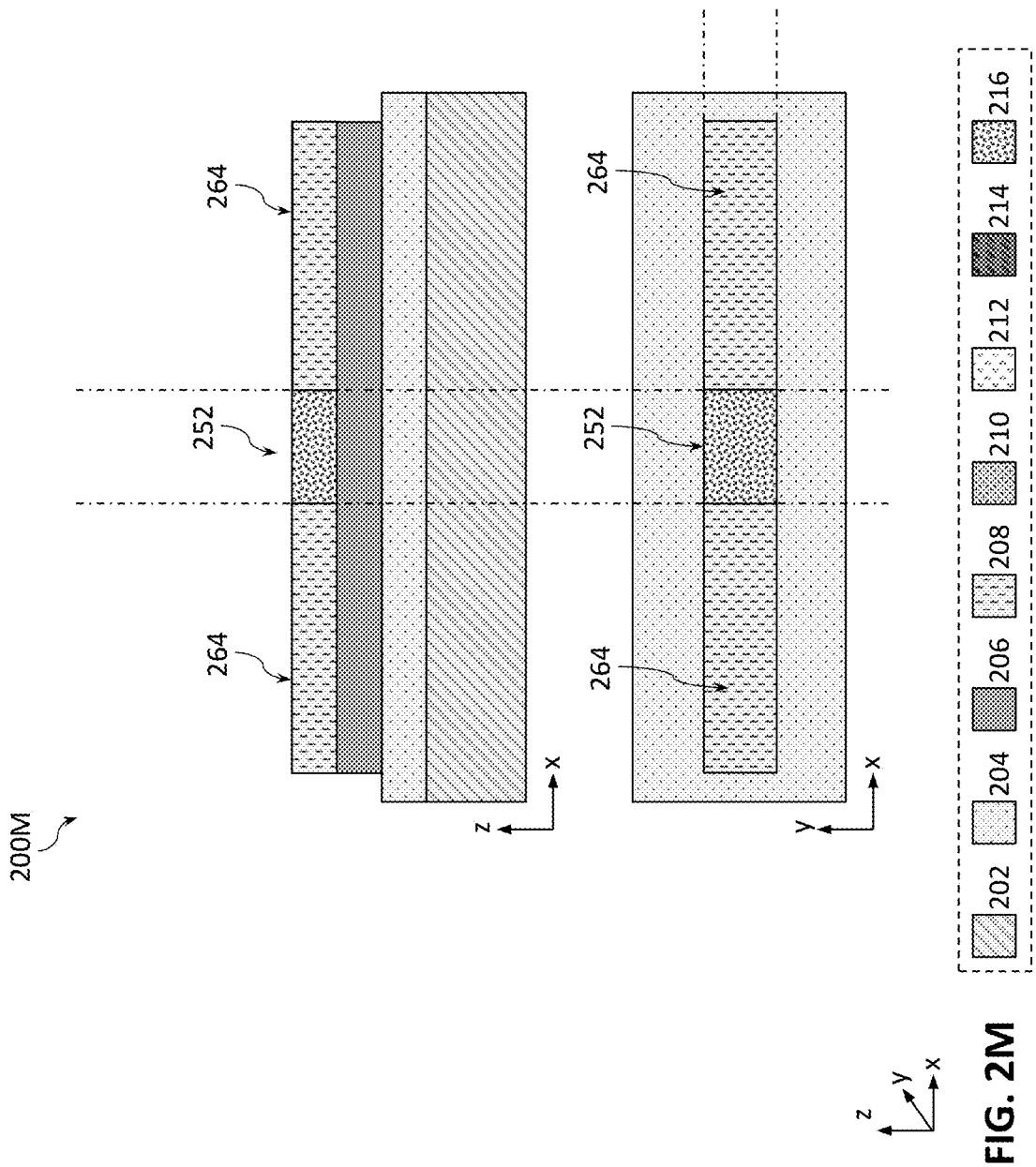
Figure 2N:
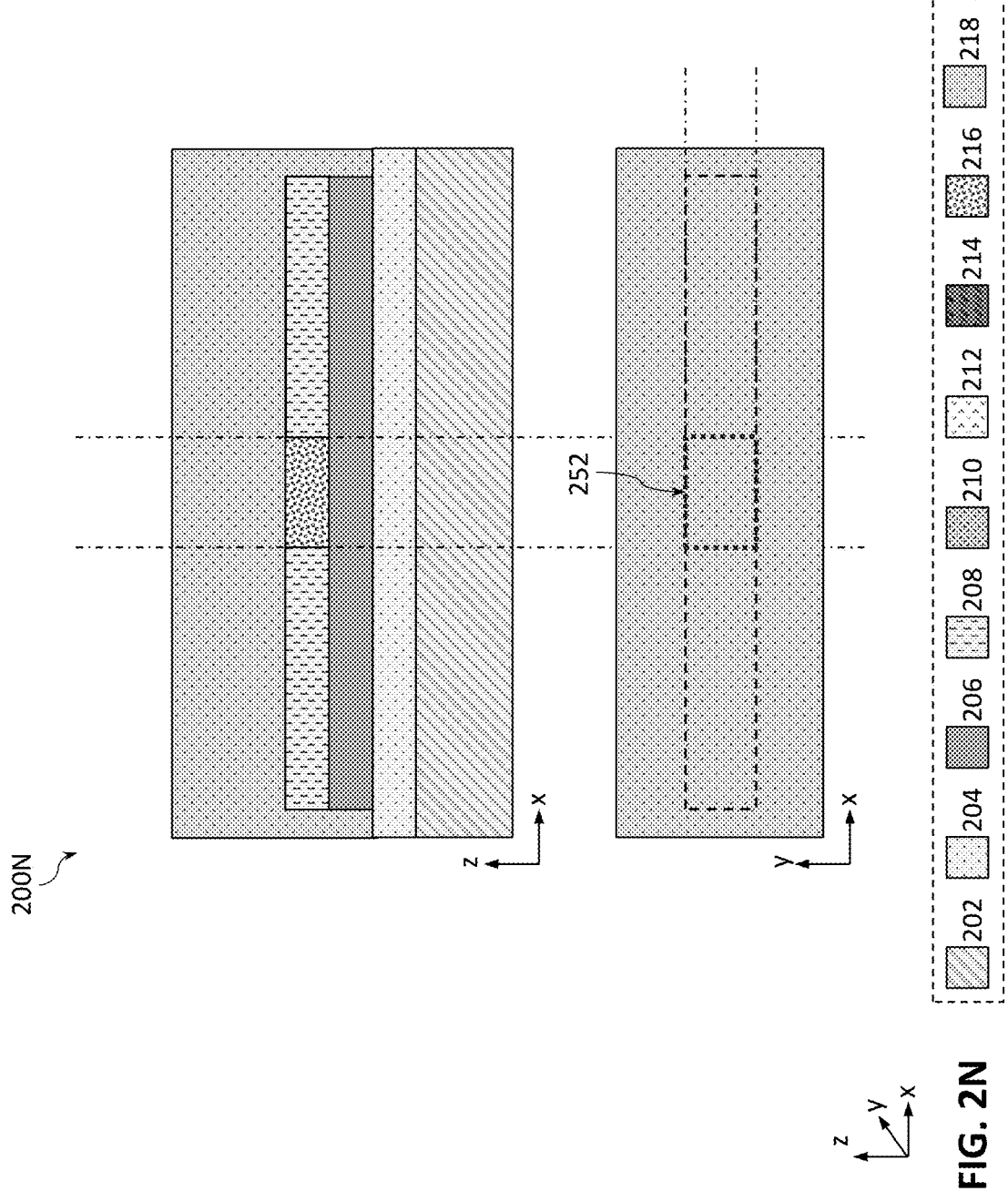
Figure 2O:
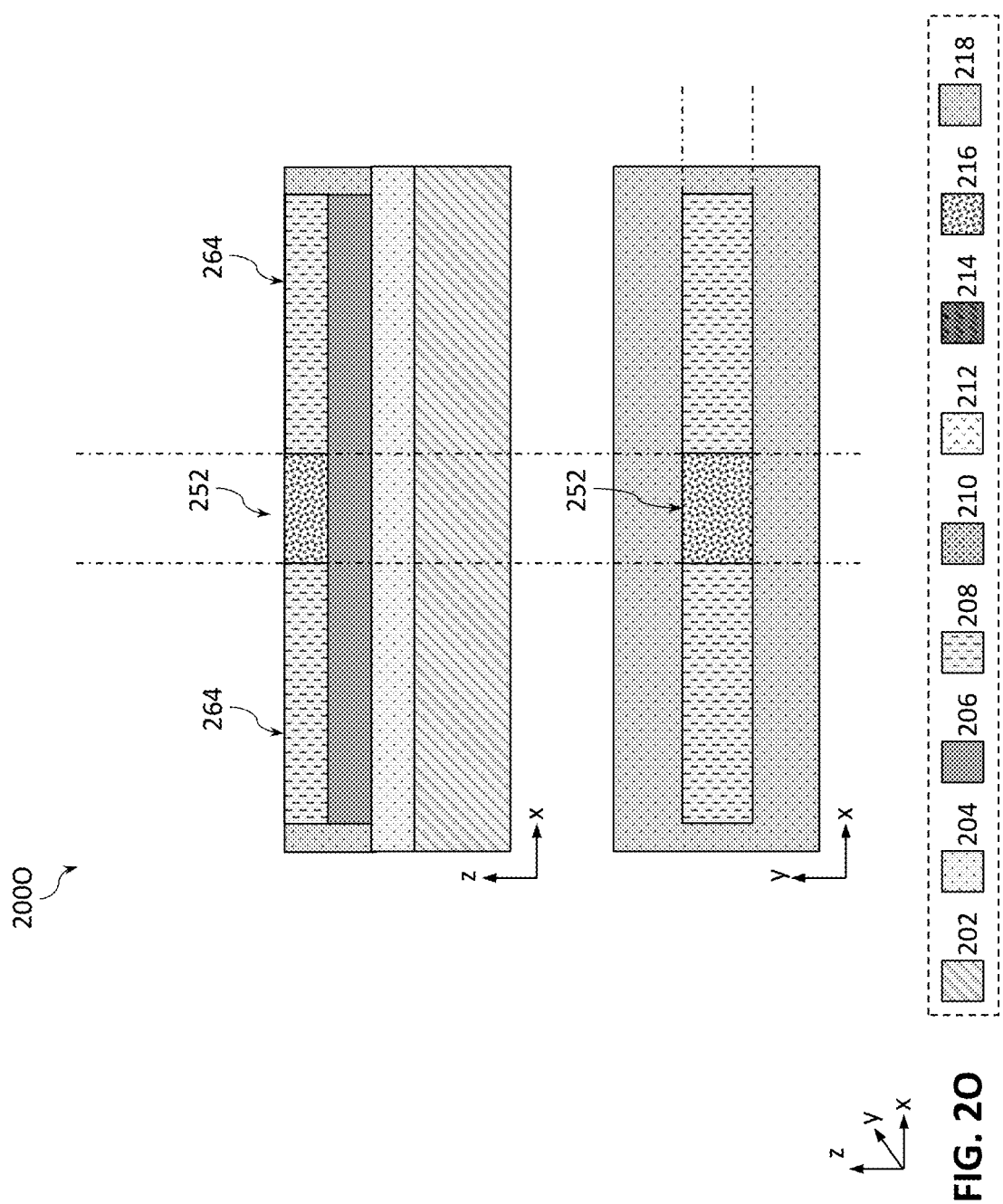
Figure 2P:
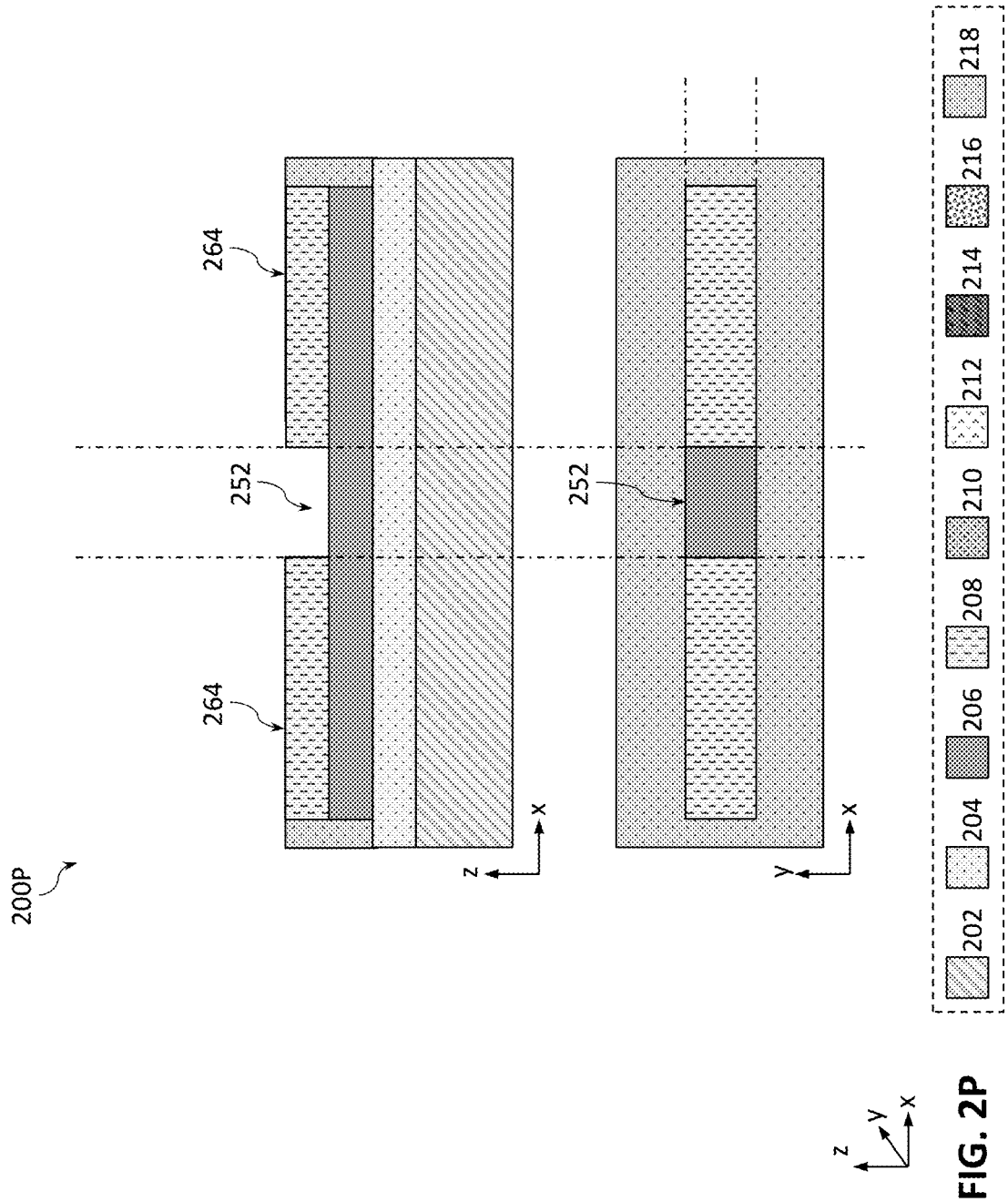
Figure 2Q:
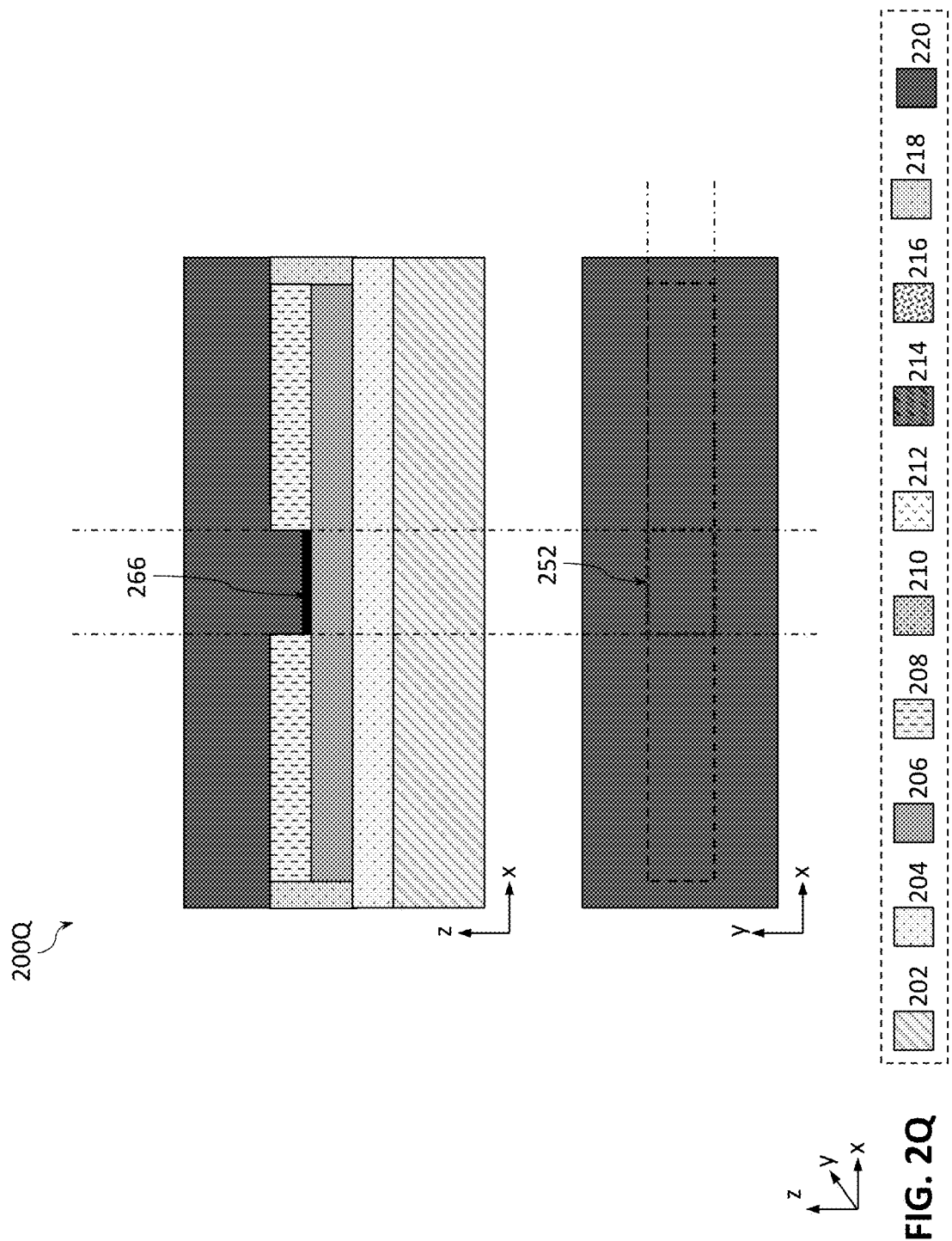
Figure 2R:
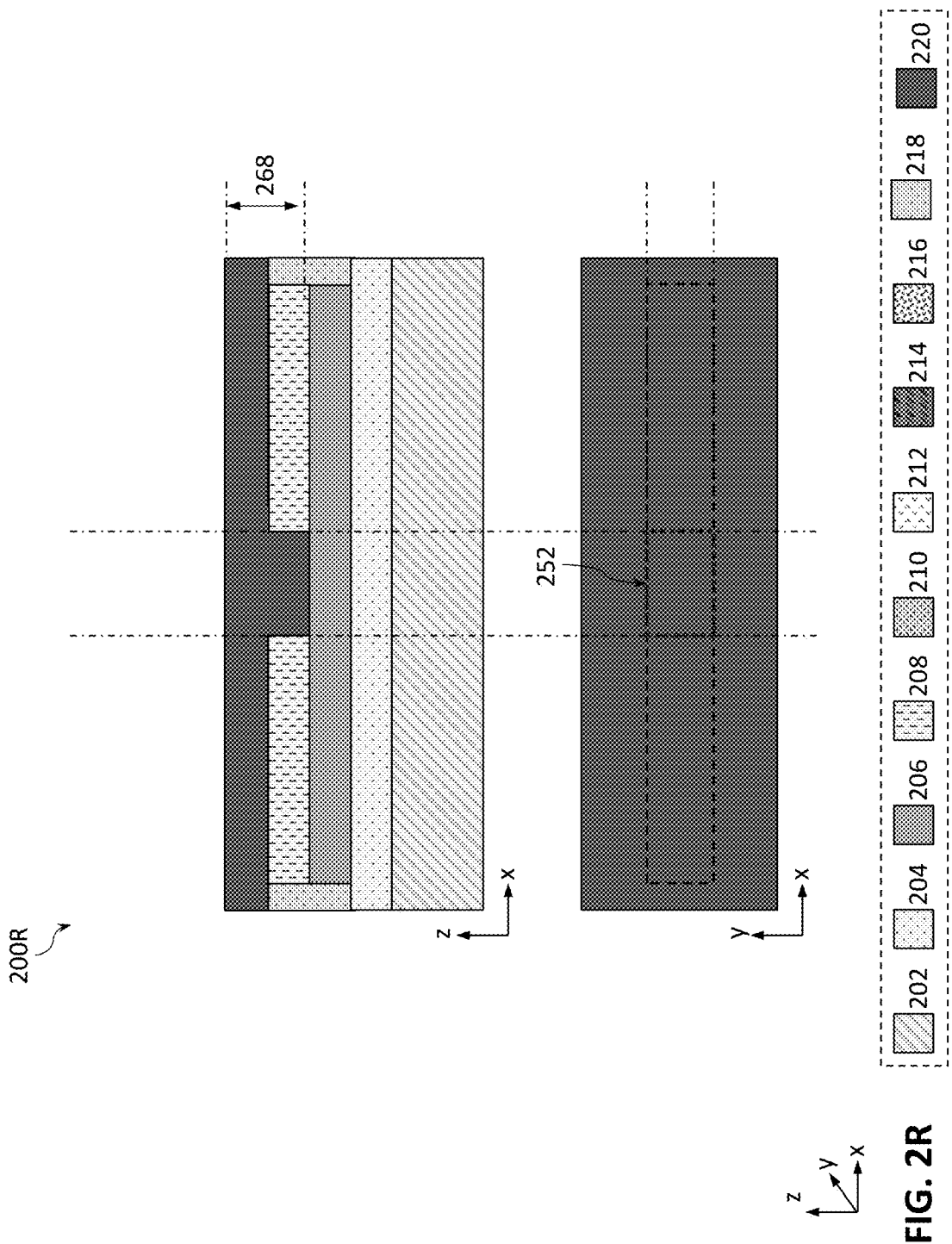
Figure 2S:
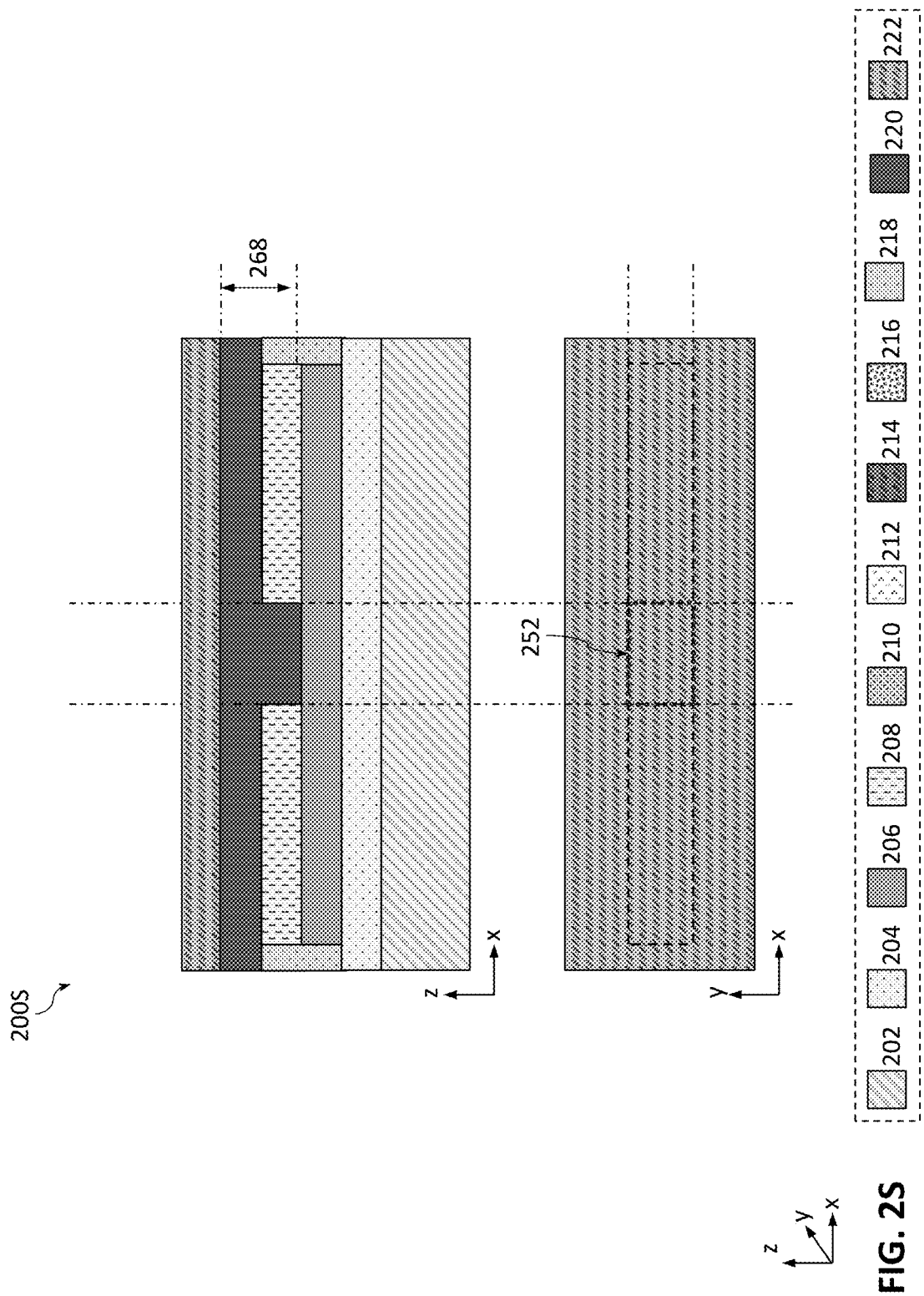
Figure 2T:
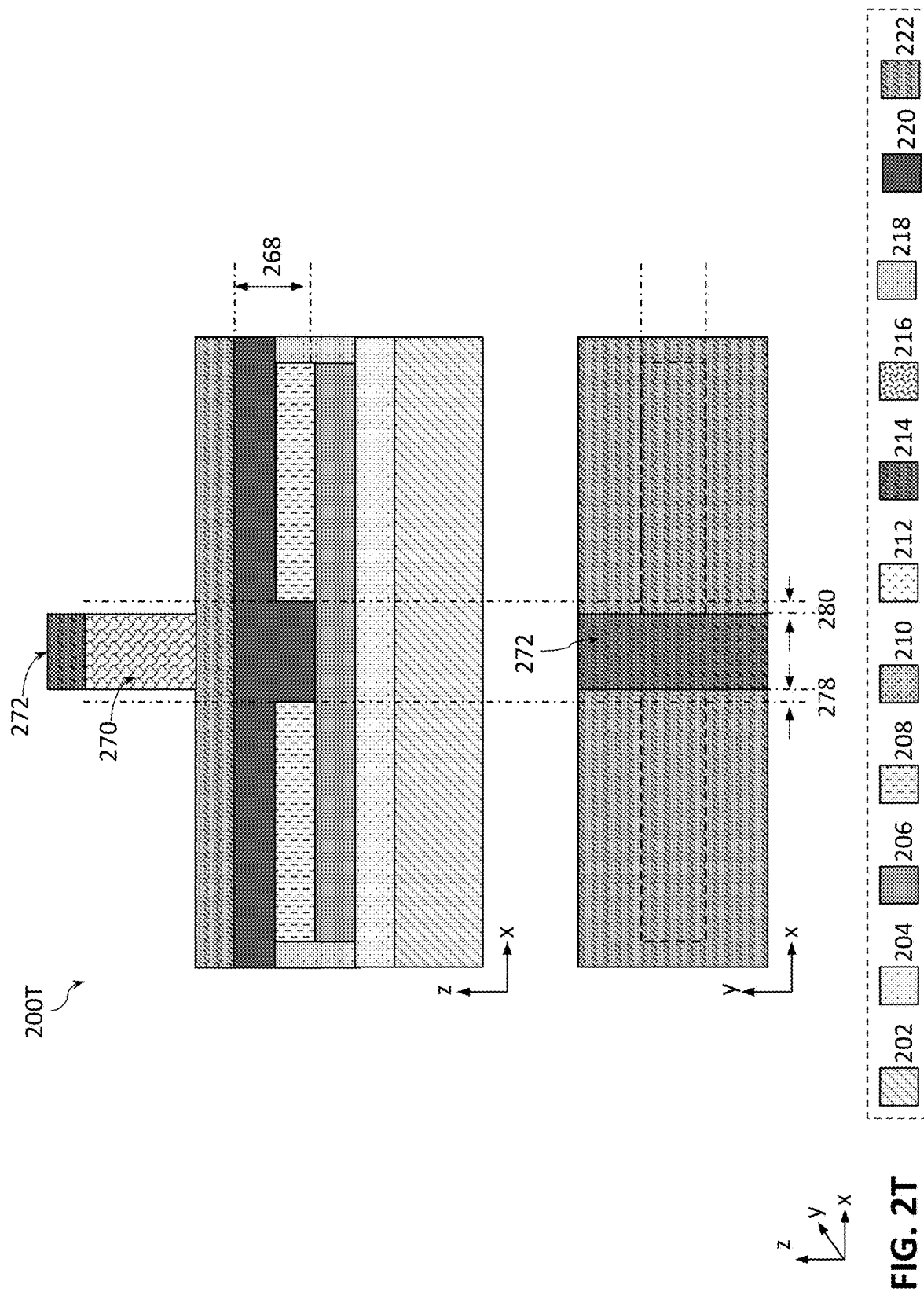
Figure 2U:
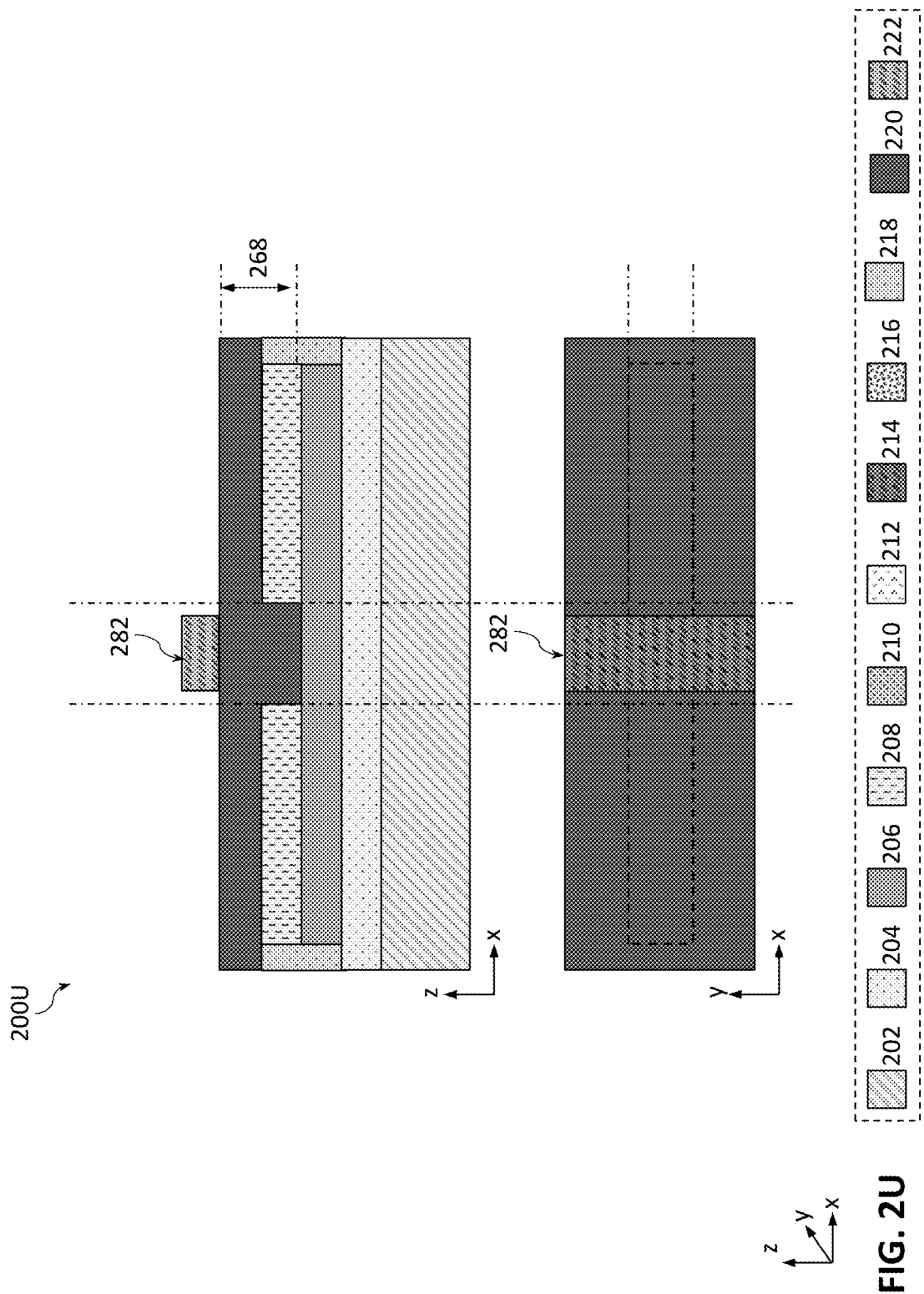
Figure 2V:
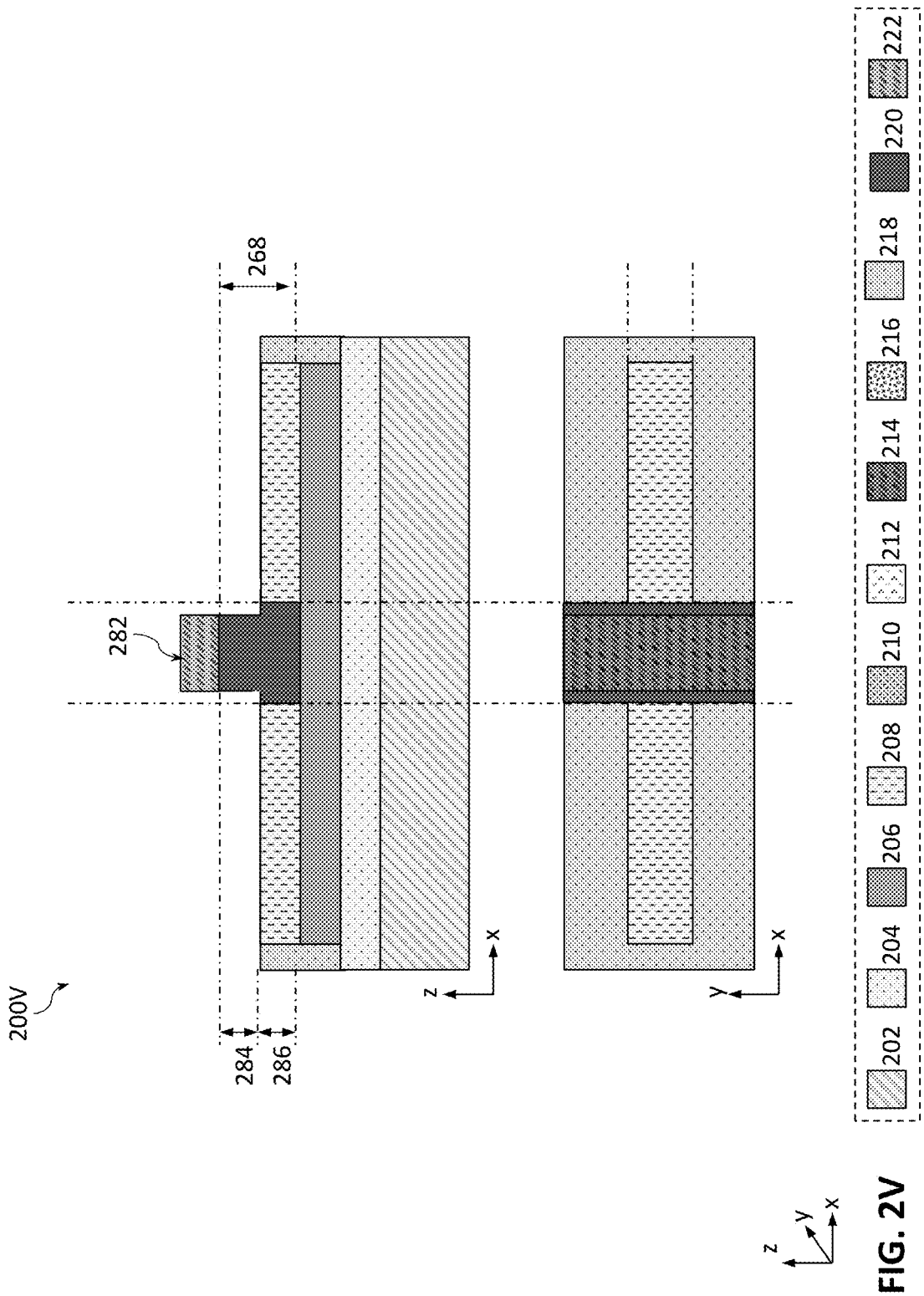
Figure 2W:
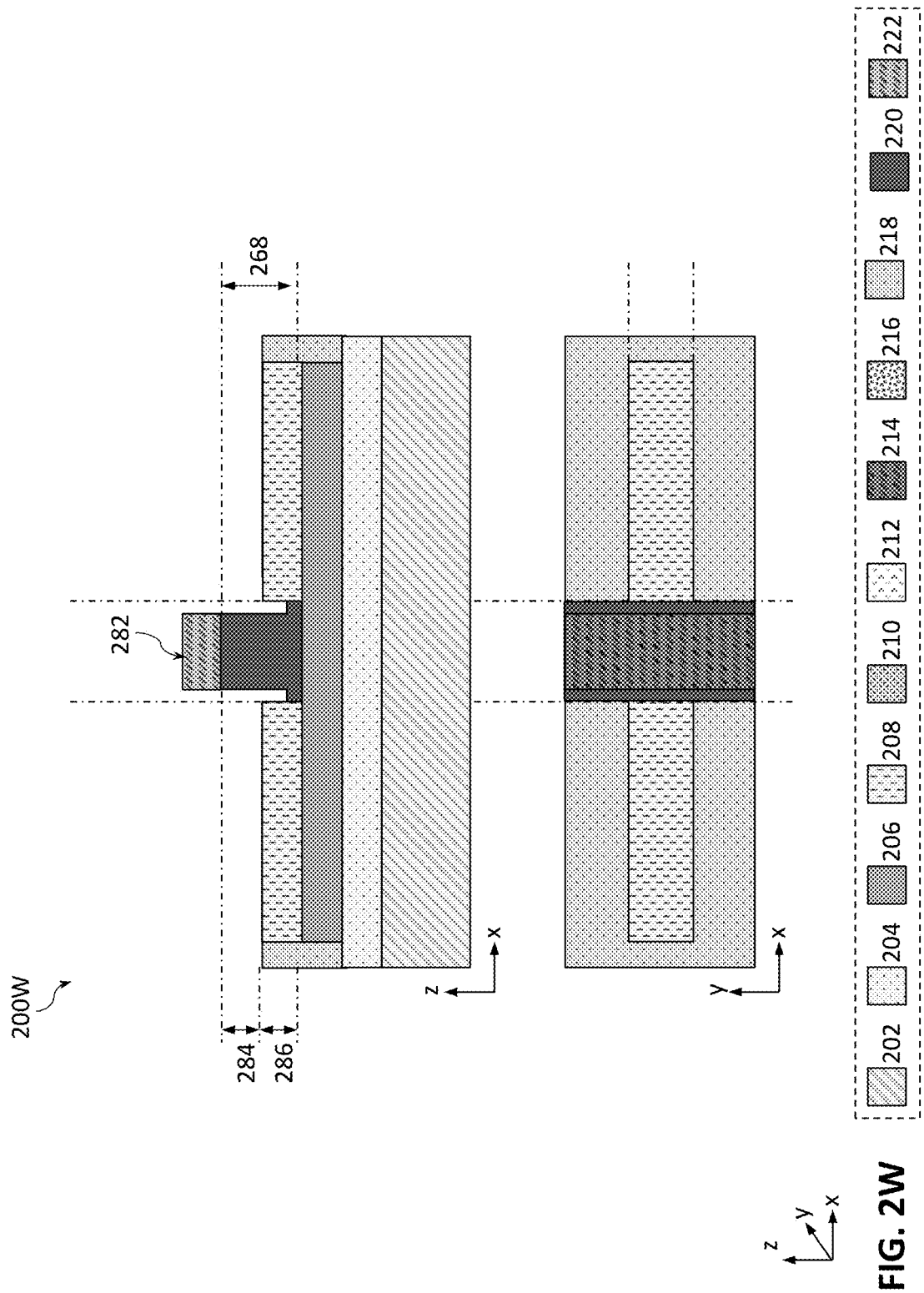
Figure 2X:
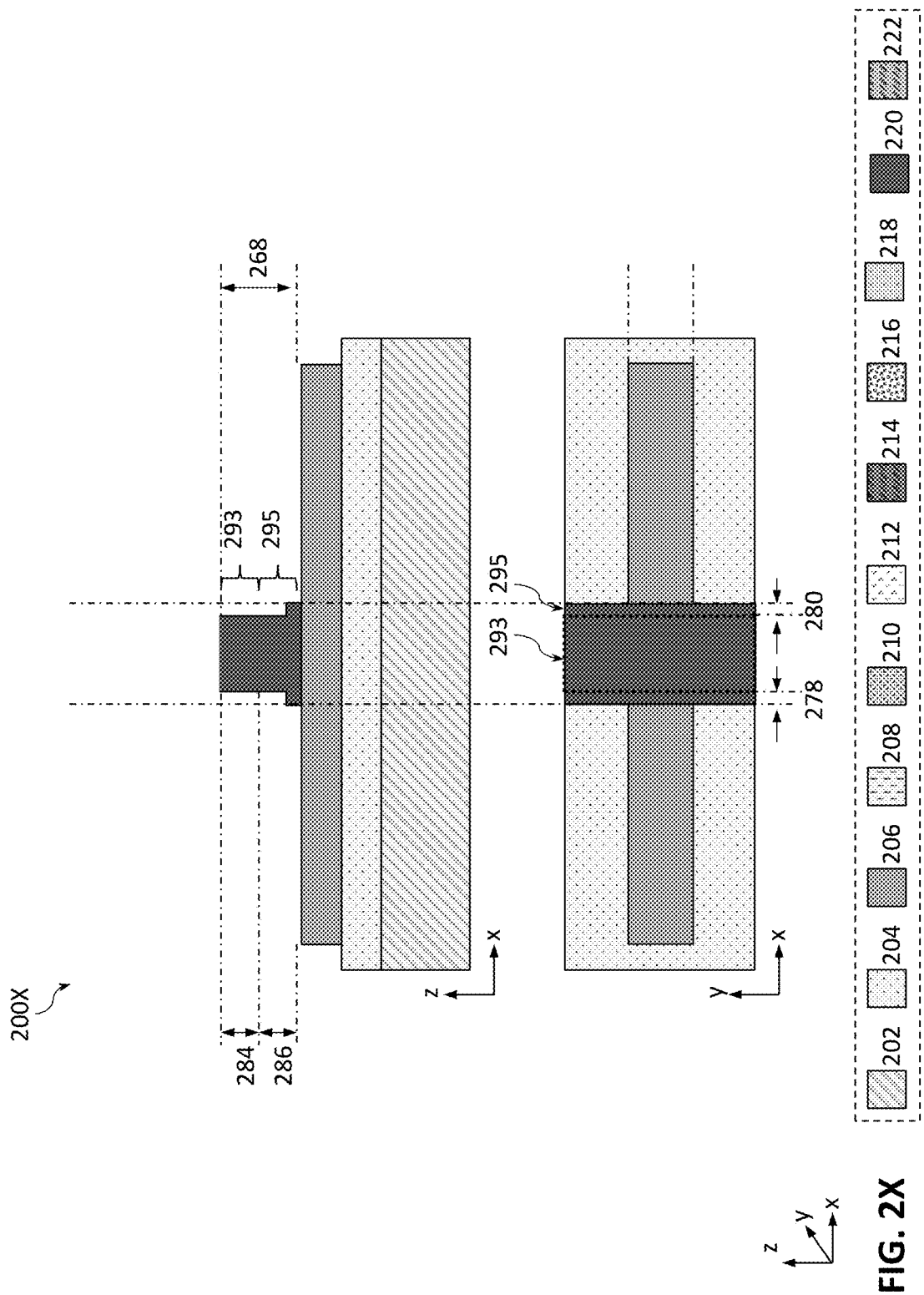
Figure 2Z:
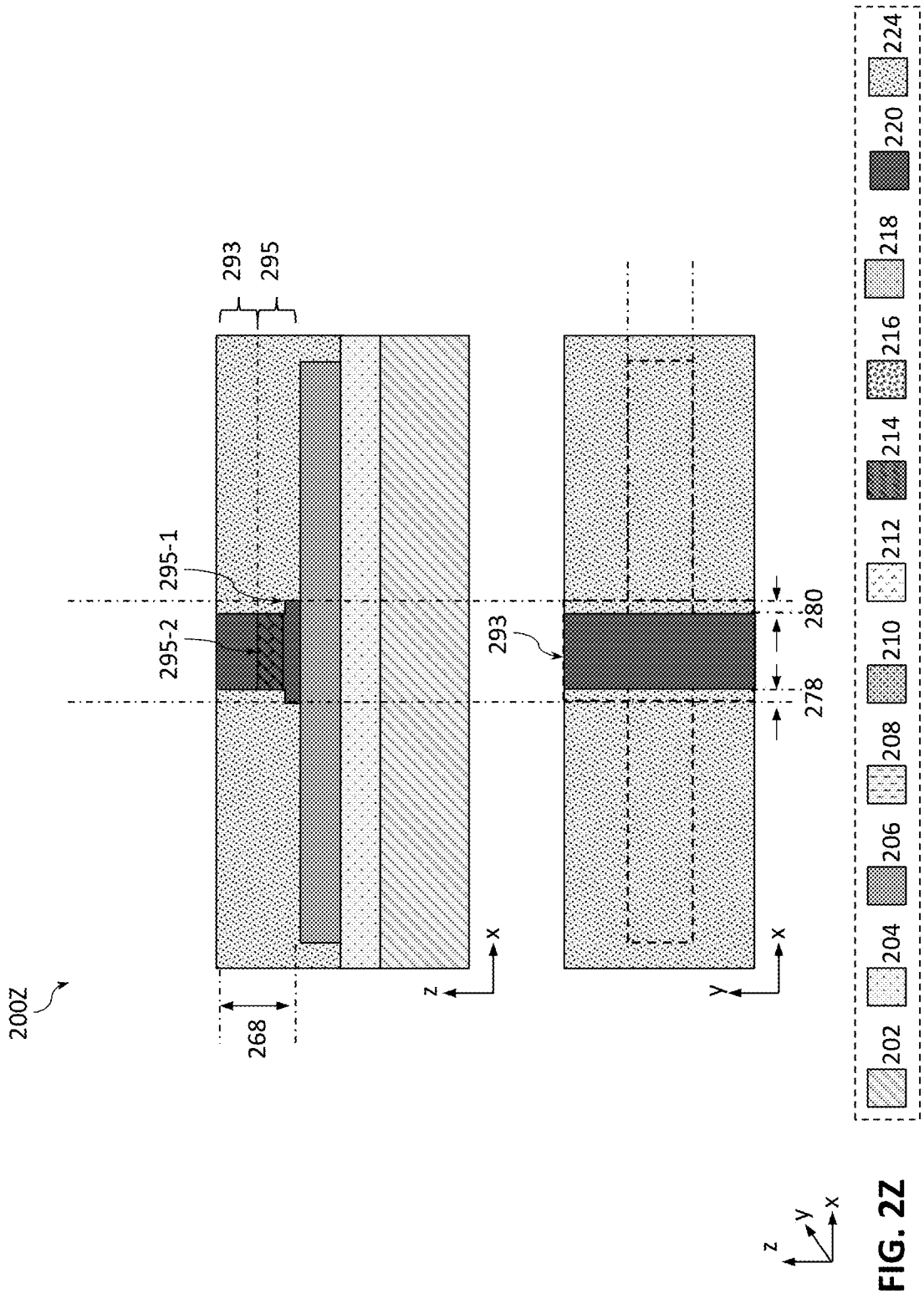

Various operations of the method 100 may be illustrated with reference to the example embodiments shown in FIGS. 2A-2Z, illustrating cross-sectional side and top-down views for various stages in the manufacture of an example IC structure 200 (e.g., the IC structure 200A shown in FIG. 2A, 200B shown in FIG. 2B, and so on until 200Y shown in FIG. 2Y) according to the fabrication method 100, in accordance with some embodiments. In particular, the top illustration of each of FIGS. 2A-2Z shows a cross-section side view of the IC structure 200 (i.e., the cross-section taken along the x-z plane of the reference coordinate system x-y-z shown in FIGS. 2A-2Z, e.g., the cross-section taken along a plane shown in FIG. 2A with a dashed line AA), while the bottom illustration shows a top-down view of the IC structure 200 (i.e., the view of the x-y plane of the reference coordinate system).

A number of elements referred to in the description of FIGS. 2A-2Z with reference numerals are illustrated in these figures with different patterns, with a legend showing the correspondence between the reference numerals and patterns being provided at the bottom of each drawing page containing FIGS. 2A-2Z. For example, the legend illustrates that FIGS. 2A-2Z use different patterns to show a support structure 202, a dielectric 204, a first electrically conductive material 206, etc. Furthermore, although a certain number of a given element may be illustrated in some of FIGS. 2A-2Z (e.g., one bottom metal line, one top metal line, and one self-aligned via in between), this is simply for ease of illustration, and more, or less, than that number may be included in an IC structure according to various embodiments of the present disclosure. Still further, various IC structure views shown in FIGS. 2A-2Z are intended to show relative arrangements of various elements therein, and that various IC structures, or portions thereof, may include other elements or components that are not illustrated (e.g., transistor portions, various components that may be in electrical contact with any of the bottom metal line, the top metal line, and the self-aligned via in between, etc.).

Turning to FIG. 1, the method 100 may begin with a process 102 that includes providing, over a support structure, a stack of a bottom dielectric material, a first electrically conductive material, a top dielectric material, and a sacrificial material. An IC structure 200A, depicted in FIG. 2A, illustrates an example result of the process 102. As shown in FIG. 2A, the IC structure 200A may include a support structure 202, with a stack 230 provided thereon. The stack 230 may include a bottom dielectric material 204, a first electrically conductive material 206, a top dielectric material 208, and a sacrificial material 210.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 202 may include any such substrate, possibly with some layers and/or devices already formed thereon, not specifically shown in the present figures, providing a suitable surface for forming the self-aligned vias integrated in the BEOL thereon.

Each of the layers of the bottom dielectric material 204 and the top dielectric material 208 may be formed in the process 102 using any suitable deposition technique such as, but not limited to, spin-coating, dip-coating, atomic layer deposition (ALD), physical vapor deposition (PVD) (e.g., evaporative deposition, magnetron sputtering, or e-beam deposition), or chemical vapor deposition (CVD). In various embodiments, the bottom dielectric material 204 and the top dielectric material 208 may include one or more materials typically used as an interlayer dielectric (ILD). For example, the bottom dielectric material 204 and the top dielectric material 208 may be formed using dielectric materials known for their applicability in ICs, such as low-k dielectric materials. Examples of dielectric materials that may be used as any of the bottom dielectric material 204 and the top dielectric material 208 may include, but are not limited to, silicon dioxide ($SiO_2$), carbon-doped oxide (CDO), silicon nitride, fluorosilicate glass (FSG), and organosilicates such as silsesquioxane, siloxane, or organosilicate glass. In some embodiments, any of the bottom dielectric material 204 and the top dielectric material 208 may include organic polymers such as polyimide, polynorbornenes, benzocyclobutene, perfluorocyclobutane, or polytetrafluoroethylene (PTFE). Still other examples of low-k dielectric materials that may be used as any of the bottom dielectric material 204 and the top dielectric material 208 include silicon-based polymeric dielectrics such as hydrogen silsesquioxane (HSQ) and methylsilsesquioxane (MSQ).

A layer of the first electrically conductive material 206 may be formed in the process 102 using a deposition technique such as, but not limited to, ALD, CVD, plasma enhanced CVD (PECVD), PVD, or electroplating. In general, various electrically conductive materials described herein, e.g., the first electrically conductive material 206 deposited as a part of the stack 230 in the process 102, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals.

The sacrificial material 210, deposited as a part of the stack 230, may include any material that has sufficient etch selectivity with respect to the top dielectric material 208. As known in the art, two materials are said to have "sufficient etch selectivity" when etchants used to etch one material do not substantially etch the other, enabling selective etching of one material but not the other. In some embodiments, the sacrificial material 210 may be a sacrificial dielectric material, e.g. any of the dielectric materials described above for use as the bottom dielectric material 204 or the top dielectric material 208, as long as different dielectric materials with sufficient etch selectivity are used for the top dielectric material 208 and the sacrificial material 210. For example, in some embodiments, the top dielectric material 208 may include a dielectric material including, or being, one or more of a silicon oxide (i.e. a compound comprising silicon and oxygen, e.g. SiO2) and a hafnium oxide (i.e. a compound comprising hafnium and oxygen e.g. HfO2), while the sacrificial material 220 may include a dielectric or conductive material having sufficient etch selectivity with respect to the material of the top dielectric material 208 and being selected as one or more of a titanium nitride (i.e. a compound comprising titanium and nitrogen, e.g. TiN), a silicon oxide, a hafnium oxide, a silicon nitride (i.e. a compound comprising silicon and nitrogen, e.g. SiN), a silicon oxynitride (i.e. a compound comprising silicon, oxygen, and nitrogen, e.g. SiON), an aluminum oxide (i.e. a compound comprising aluminum and oxygen, e.g. Al2O3), an aluminum hafnium oxide (i.e. a compound comprising aluminum, hafnium, and oxygen, e.g. AlHfO), a carbon-doped oxide (i.e. a compound comprising carbon and oxygen), organic polymers such as perfluorocyclobutane or polytetrafluoroethylene, fluorosilicate glass (FSG), and organosilicates such as silsesquioxane, siloxane, or organosilicate glass. Besides appropriate etching characteristics, some other considerations in selecting a suitable material for forming the layer of the sacrificial material 210 may include e.g. possibilities of smooth film formation, and low shrinkage and outgassing.

The method 100 may then continue with a process 104 that includes patterning the sacrificial material provided in the process 102 to form an opening to define a shape and a location of the future bottom metal line. An IC structure 200B, depicted in FIG. 2B, illustrates an example result of the process 104. As shown in FIG. 2B, the IC structure 200B includes an opening 232 in the sacrificial material 210. The opening 232 may have any suitable dimensions for the future bottom metal line. For example, in some embodiments, the length of the opening 232 (e.g., a dimension measured along the x-axis of the example coordinate system shown in FIG. 2B) may be between about 20 and 1000 nanometers, including all values and ranges therein, e.g., between about 50 and 500 nanometers, or between about 100 and 200 nanometers. On the other hand, in some embodiments, the width of the opening 232 (e.g., a dimension measured along the y-axis of the example coordinate system shown in FIG. 2B) may be between about 5 and 100 nanometers, including all values and ranges therein, e.g., between about 10 and 50 nanometers, or between about 12 and 24 nanometers.

In various embodiments, any suitable patterning techniques may be used in the process 104, such as, but not limited to, photolithographic or electron-beam (e-beam) patterning, possibly in conjunction with a suitable etching technique, e.g., a dry etch, such as e.g., radio frequency (RF) reactive ion etch (RIE) or inductively coupled plasma (ICP) RIE. In some embodiments, the etch performed in the process 104 may include an anisotropic etch (i.e., etching uniformly in a vertical direction without substantially etching in other directions), using etchants in a form of e.g., chemically active ionized gas (i.e., plasma) using e.g., bromine (Br) and chloride (Cl) based chemistries. Typically, a dry etch results in anisotropic etching, whereas a wet etch results in isotropic etching (i.e., etching in substantially all directions). In some embodiments, during the etch of the process 104, the IC structure may be heated to elevated temperatures, e.g., to temperatures between about room temperature and 200 degrees Celsius, including all values and ranges therein, to promote that byproducts of the etch are made sufficiently volatile to be removed from the surface. The etch selectivity of the top dielectric material 208 with respect to the sacrificial material 210 comes into play in the process 104 in that etchants used to etch portions of the sacrificial material 210 to form the opening 232 do not substantially etch the top dielectric material 208. As a result, the etch of the process 104 substantially stops once the surface 234 of the top dielectric material 208 is exposed within the opening 232.

The method 100 may then continue with a process 106 that includes patterning the top dielectric material 208 through the opening 232 formed in the process 102 to form an opening for the future via (i.e., to form an opening that defines a shape and a location of the future via). FIGS. 2C-2G illustrate various intermediate results of performing the process 106 for the embodiment when a lithographic process is used to form the via opening.

In such an embodiment, first, a photoresist layer may be provided over the structure formed in the process 104. A result of this is illustrated with an IC structure 200C, depicted in FIG. 2C, showing a photoresist material 212 provided over the IC structure 200B. The dashed contour labeled with a reference numeral 232, shown in the top-down view of FIG. 2C and in some of the subsequent drawings, indicates the outline of the opening 232 under the topmost layer shown in the drawing, in this case—under the photoresist material 212.

Next, a patterned mask may be provided over the photoresist layer. A result of this is illustrated with an IC structure 200D, depicted in FIG. 2D, showing a mask material 214 provided over the photoresist material 212, where the mask material 214 is patterned to form an opening 236 that exposes a portion of the photoresist material 212 underneath. The dot-dashed lines shown in FIG. 2D and in some of the subsequent drawings are provided to illustrate alignment between various materials and elements. In particular, FIG. 2D illustrates that the opening 236 may not necessarily perfectly align with the bottom metal line opening 232, e.g., the opening 236 may extend by distances 238 and 240 with respect to the width of the bottom metal line opening 232. For example, in various embodiments, any one of the distances 238 and 240 may be between about 0 and 10 nanometers, including all values and ranges therein, e.g., between about 1 and 7 nanometers, or between about 2 and 5 nanometers. Thus, in some embodiments, the width of the opening 236 (e.g., a dimension measured along the y-axis of the example coordinate system shown in FIG. 2D) may be between about 5 and 110 nanometers, including all values and ranges therein, e.g., between about 10 and 60 nanometers, or between about 10 and 30 nanometers, and may be greater than the width of the opening 232. In some embodiments, the dimension of the opening 236 measured along the x-axis of the example coordinate system shown in FIG. 2D may be substantially the same as the dimension of the opening 236 measured along the y-axis.

Next, the process 106 may proceed with exposing the photoresist material 212 to patterned actinic radiation through the patterned opening 236 in the mask 214, then the exposed portion of the photoresist material 212 may be developed in order to form an opening in the photoresist material 212, which may be referred to as a via location opening in the photoresist material 212. A result of this is illustrated with an IC structure 200E, depicted in FIG. 2E, showing that the photoresist material 212 exposed by the opening 236 in the mask 214 is removed to form a via location opening 242 in the photoresist material 212. This opening 242 in the top dielectric material 208 may be referred to as a "via location opening." Because the patterning of the photoresist material 212 in the process 106 is defined by the opening 236 in the mask material 214, the dimensions of the via location opening 242 in the photoresist material 212 are substantially the same as those of the opening 236, described above. However, once a portion of the photoresist material 212 defined by the mask opening 236 is removed, what is exposed at the bottom of the via location opening 242 are the edges 248 and 250 of the sacrificial material 210 and the top dielectric material 208 in between. The edges 248 and 250 are portions of the sacrificial material 210 which become exposed as a result of removing the portion of the photoresist material 212 defined by the mask opening 236, whereas the top dielectric material 208 in between the edges 248 and 250 is the defined by forming the opening 232 for the bottom metal line. Thus, in the IC structure 2E, the edges 248 and 250 extend, in the y-direction, beyond the top dielectric material 208 in between by distances 238 and 240, respectively, which were described above. The edges 248 and 250 may be referred to as self-aligned edges because they will be used to align the y-axis dimension of the opening in the top dielectric material 208 to that of the opening 232 in the next step of the process 106, shown in FIG. 2F.

Next in the process 106, the via location opening 242 in the photoresist material 212 may be used as an etch mask for forming an opening in the top dielectric material 208. To that end, the top dielectric material 208 may be etched through the via location opening 242 in the photoresist material 212. A result of this is illustrated with an IC structure 200F, depicted in FIG. 2F, showing that a portion of the top dielectric material 208 exposed by the via location opening 242 is removed, forming an opening 252 in the layer of the top dielectric material 208. This opening 252 in the top dielectric material 208 may be referred to as a via opening. The etch selectivity of the top dielectric material 208 and the sacrificial material 210 comes into play here again in that, when an etch is performed through the via location opening 242, the portion of the top dielectric material 208 exposed by the via location opening 242 is removed without substantially etching the edges 248 and 250 of the sacrificial material 210, which were also exposed by the via location opening 242. As a result, the opening 252 is aligned in the y-axis direction with the opening 232 for the future bottom metal line (despite the fact that the mask opening 236 was not so aligned). Any suitable anisotropic etch process, e.g., a dry etch, may be used in the process 106 to etch the top dielectric material 208 through the via location opening 242. In some embodiments, during the etch of the top dielectric material 208 in the process 106, the IC structure may be heated to elevated temperatures, e.g., to temperatures between about room temperature and 200 degrees Celsius, including all values and ranges therein, to promote that byproducts of the etch are made sufficiently volatile to be removed from the surface.

The process 106 may conclude with removing the photoresist material and the patterned mask. A result of this is illustrated with an IC structure 200G, depicted in FIG. 2G, showing that the photoresist material 212 and the mask material 214 are removed, leaving the opening 252 in the top dielectric material 208.

It should be noted that while the descriptions of the process 106 refer to photolithographic patterning to form the via opening 252 using the self-aligned edges 248 and 250, in other embodiments of the process 106 other patterning techniques may be used instead or in addition to the photolithographic patterning. Some examples of such other patterning techniques include e-beam lithography, nanoimprint, direct self-assembly (DSA) patterning, or any other technique suitable for forming the via opening 252 through the self-aligned edges 248 and 250.

The method 100 may then continue with a process 108 that includes filling the opening for the bottom metal line (formed in the process 104) and the via opening (formed in the process 106) with an etch block material and then polishing back the excess etch block material to expose the sacrificial material. FIGS. 2H-2I illustrate various intermediate results of performing the process 108. In particular, first, a layer of an etch block material may be deposited over the IC structure formed in the process 106. A result of this is illustrated with an IC structure 200H, depicted in FIG. 2H, showing an etch block material 216 provided over the IC structure 200G. The top-down view of FIG. 2H also illustrates an outline of the opening 232 and an outline of the via opening 252 under the etch block material 216. The etch block material 216 may be deposited using any suitable deposition technique such as, but not limited to, spin-coating, dip-coating, ALD, PVD, or CVD. The etch block material 216 may include any suitable dielectric or conductive material, e.g., any of the materials described above (e.g., silicon nitride) that are etch selective with respect to the sacrificial material 210. For example, the sacrificial material 210 may include titanium nitride while the etch block material 216 may include silicon nitride. Then, the excess amount of the etch block material 216 may be removed (a process typically referred to as "planarization") to expose the upper surfaces of the sacrificial material 210 defining the opening 232 (which opening is now filled with the etch block material 216). A result of this is illustrated with an IC structure 200I, depicted in FIG. 2I, showing that the etch block material 216 is polished back to expose the upper surfaces 254 of the sacrificial material 210 around the opening 232 filled with the etch block material 216. The top-down view of FIG. 2I also illustrates an outline of the via opening 252 under the etch block material 216 within the opening 232. In various embodiments, planarization of the process 108 may be performed using either wet or dry planarization processes. In one embodiment, planarization of the process 108 may be performed using CMP to remove the overburden of the etch block material 216 and planarize the surface of the IC structure 200H to expose the upper surfaces 254 of the sacrificial material 210. In other embodiments, planarization of the process 108 may be performed using timed anisotropic etch.

The method 100 may then continue with a process 110 that includes performing selective etches to remove the sacrificial material around the opening filled with the etch block material (result of the process 108), the top dielectric material (provided in the process 102), and the first electrically conductive material 206 (provided in the process 102), using the etch block material 216 as the etch block for these etches. FIGS. 2J-2L illustrate various intermediate results of performing the process 110. In particular, first, the sacrificial material 110 around the opening 232 filled with the etch block material 216 is removed. A result of this is illustrated with an IC structure 200J, depicted in FIG. 2J, showing that now a structure 260, of the etch block material 216 shaped to fill the opening 232 and the opening 252 is remaining in the IC structure 200J. The etch selectivity of the etch block material 216 with respect to the sacrificial material 210 comes into play during this etch of the process 110 in that etchants used to etch the exposed portions of the sacrificial material 210 do not substantially etch the etch block material 216. To that end, either a wet etch or a dry etch may be performed to substantially fully remove the sacrificial material 210 selective to other surrounding materials. Next, portions of the top dielectric material 208 exposed by the structure 260 are etched. A result of this is illustrated with an IC structure 200K, depicted in FIG. 2K. The etch selectivity of the etch block material 216 with respect to the top dielectric material 208 comes into play during this etch of the process 110 in that etchants used to etch the exposed portions of the top dielectric material 208 do not substantially etch the etch block material 216. Finally, portions of the first electrically conductive material 206 exposed by the structure 260 and the removal of the portions of the top dielectric material 208 are etched. A result of this is illustrated with an IC structure 200L, depicted in FIG. 2L. The etch selectivity of the etch block material 216 with respect to the first electrically conductive material 206 comes into play during this etch of the process 110 in that etchants used to etch the exposed portions of the first electrically conductive material 206 do not substantially etch the etch block material 216. The remaining portion of the first electrically conductive material 206 forms a bottom metal line 263 of the BEOL metallization stack. As can be seen in FIG. 2L, the bottom metal line 263 is a portion of the first electrically conductive material 206 that was shaped according to the shape of the opening 232 that was formed in the process 104, i.e., the bottom metal like 263 is the first electrically conductive material 206 under the upper portion 262 of the structure 260. In some embodiments, etching used to remove portions of the top dielectric material 208 and portions of the first electrically conductive material 206 in the process 110 may be a dry etch (i.e., anisotropic) in order to avoid or at least minimize the undercutting of the upper portion 262 of the structure 260 of the etch block material 216.

Next, the method 100 may then continue with a process 112 that includes removing the etch block material from the via opening 252 to prepare for filling the via opening with an electrically conductive material. FIGS. 2M-2P illustrate various intermediate results of performing the process 112. In particular, first, the upper portion 262 of the structure 260 of the etch block material 216 is removed. A result of this is illustrated with an IC structure 200M, depicted in FIG. 2M, showing that a portion of the etch block material 216 is removed to expose the upper surfaces 264 of the top dielectric material 208 and to expose the etch block material 216 within the opening 252. In some embodiments, a planarization technique such as CMP may be used for this purpose. In other embodiments, a timed anisotropic etch may be used. Next, a dielectric material 218 may be provided over the IC structure 200M. A result of this is illustrated with an IC structure 200N, depicted in FIG. 2N, showing a dielectric material 218. The dielectric material 218 may be deposited using any suitable deposition technique such as, but not limited to, spin-coating, dip-coating, ALD, PVD, or CVD. The dielectric material 218 may include any suitable dielectric material, e.g., any of the dielectric materials described above (e.g., silicon oxide). Subsequently, excess of the dielectric material 218 may be removed. A result of this is illustrated with an IC structure 200O, depicted in FIG. 2O, showing that a portion of the dielectric material 218 is removed to expose the upper surfaces 264 of the top dielectric material 208 and to expose the etch block material 216 within the opening 252. In some embodiments, a planarization technique such as CMP may be used for this purpose. Finally, the etch block material 216 may be removed from the opening 252. A result of this is illustrated with an IC structure 200P, depicted in FIG. 2P. During this etch, the etch selectivity of the etch block material 216 with respect to the top dielectric material 208 comes into play again in that etchants used to etch the etch block material 216 do not substantially etch the top dielectric material 208.

The method 100 may then continue with a process 114 that includes providing a second electrically conductive material of a target thickness. FIGS. 2Q-2R illustrate various intermediate results of performing the process 114.

In particular, first, a second electrically conductive material is deposited. A result of this is illustrated with an IC structure 200Q, depicted in FIG. 2Q showing that a second electrically conductive material 220 is deposited over the IC structure 200P. The second electrically conductive material 220 may include any of the electrically conductive materials described with reference to the first electrically conductive material 206. In some embodiments, the first electrically conductive material 206 and the second electrically conductive material 220 may have the same material composition. In other embodiments, their material composition may be different. Irrespective of whether the material composition of the first electrically conductive material 206 and the second electrically conductive material 220 is the same or different, because they are deposited at different processes, there may be a grain boundary present at their interface, e.g., along a line 266, shown in FIG. 2Q. Such a grain boundary may be detectable using imaging by a suitable characterization equipment, such as TEM.

Next, some of the second electrically conductive material 220 may be removed so that a thickness of the second electrically conductive material 220 as measured from the bottom of the via opening 252 is at a target value. A result of this is illustrated with an IC structure 200R, depicted in FIG. 2R, showing that the second electrically conductive material 220 measured from the bottom of the via opening 252 has a thickness 268 (e.g., a dimension measured along the z-axis of the example coordinate system shown in FIG. 2R). The thickness 268 should be such as to be sufficient to form a via and a top metal line from the portion of the second electrically conductive material 220 in and above the via opening 252.

The method 100 may then continue with a process 116 that includes providing a hardmask material and performing patterning to provide a patterned mask that defines the target shape and location for the top metal line. FIGS. 2S-2T illustrate various intermediate results of performing the process 116 for the embodiment when a lithographic process is used to form the patterned mask. In such an embodiment, first, a layer of a hardmask material is provided over the IC structure that was formed in the process 114. A result of this is illustrated with an IC structure 200S, depicted in FIG. 2S, showing a hardmask material 222 provided over the second electrically conductive material 220 of the IC structure 200R. The hardmask material 222 may include any of the materials typically used for this purpose in semiconductor manufacturing, such as silicon nitride, and may be deposited using any suitable technique such as ALD, CVD, or PVD. Next, a lithographic patterning process may be performed to provide, over the hardmask material 222, a patterned mask that defines the target shape and location for the top metal line. A result of this is illustrated with an IC structure 200T, depicted in FIG. 2T, showing an organic material 270 (e.g., a spin-on-glass (SOG) or amorphous carbon, or any other organic material that may be used as a part of a lithographic stack) provided over the IC structure 200S, then the mask material 214 provided over the organic material 270, and then photolithographic patterning defining a patterned mask 272 of the mask material 214. These photolithography steps may be performed similar to the patterning described with reference to the process 106 (illustrated in FIGS. 2C and 2D), although the exact material composition of the organic material 270 and the mask material 214 used in the process 116 may be different. In particular, FIG. 2T illustrates that the patterned mask 272 may not necessarily perfectly align with the opening 252. In particular, the patterned mask 272 may be narrower than the opening 252 by distances 278 and 280 (with respect to the width of the opening 252), as shown in FIG. 2T. For example, in various embodiments, any one of the distances 278 and 280 may be between about 0 and 10 nanometers, including all values and ranges therein, e.g., between about 1 and 7 nanometers, or between about 2 and 5 nanometers. Thus, in some embodiments, the width of the patterned mask 272 (e.g., a dimension measured along the x-axis of the example coordinate system shown in FIG. 2T) may be between about 5 and 110 nanometers, including all values and ranges therein, e.g., between about 10 and 60 nanometers, or between about 10 and 30 nanometers, and may be smaller than the width of the opening 252.

The method 100 may then continue with a process 118 that includes performing selective etches to remove the hardmask material not covered by the patterned mask formed in the process 116, this forming a patterned hardmask, and then remove the second electrically conductive material not covered by the patterned hardmask, without etching the top dielectric material and without over-etching (i.e., without etching into the first electrically conductive material). FIGS. 2U-2W illustrate various intermediate results of performing the process 118.

In particular, first, the hardmask material 222 not protected by the patterned mask 272 is removed, and then the patterned mask 272 and the organic material 270 is removed. A result of this is illustrated with an IC structure 200U, depicted in FIG. 2U, showing that now a structure 282, of the hardmask material 222, shaped in substantially the same shape as the patterned mask 272.

Next, the etching of the second electrically conductive material 220 is performed, using the hardmask material 222 of the structure 282 as an etch block. A timed anisotropic etch may be used for this purpose, e.g., a dry etch using etchants suitable for gradually removing the second electrically conductive material 220. At first, all of the second electrically conductive material 220 not protected by the structure 282 is removed. A result of this is illustrated with an IC structure 200V, depicted in FIG. 2V, showing that, at a certain point in time of the timed etch of the process 118, the second electrically conductive material 220 under the structure 282 remains (a portion of the second electrically conductive material 220 with a thickness 284, labeled in FIG. 2V), as well as the second electrically conductive material 220 that is at and below the upper surface of the top dielectric material 208 (a portion of the second electrically conductive material 220 with a thickness 286, labeled in FIG. 2V). The portion of the second electrically conductive material 220 with the thickness 284 is removed because it's not protected by the structure 282, and none of the portion of the second electrically conductive material 220 with the thickness 286 is removed because the etch has not proceeded that far yet. As the etch continues, some of the second electrically conductive material 220 of the portion 286 will be removed, namely, the portions not protected by the structure 282. A result of this is illustrated with an IC structure 200W, depicted in FIG. 2W, showing that, at the end of the timed etch of the process 118, a portion of the second electrically conductive material 220 in the via opening 252, that is not protected by the structure 282 is also etched. The top dielectric material 208 is not substantially etched at that point because the top dielectric material 208 is etch-selective with respect to the second electrically conductive material 220. After the timed etch of the process 118, the portion 284 of the second electrically conductive material 220 forms a top metal line 293, shaped in the x-y plane according to the structure 282. The remaining portion of the second electrically conductive material 220 forms a via 295 that has a bottom end interfacing the bottom metal line 263 of the BEOL metallization stack and has a top end being continuous with the top metal line 293.

The method 100 may end with a process 120 that includes removing the patterned hardmask structure, and then providing a cover dielectric, while exposing the upper surface of the top metal line. FIGS. 2X-2Z illustrate various intermediate results of performing the process 120. First, the structure 282 of the hardmask material 222 is removed. A result of this is illustrated with an IC structure 200X, depicted in FIG. 2X. Next, a dielectric material, referred to herein as a "cover dielectric" 224 may be deposited over the IC structure 200X. A result of this is illustrated with an IC structure 200Y, depicted in FIG. 2Y. Then, excess of the cover dielectric 224 may be removed so that a surface of the top metal line 293 is exposed. A result of this is illustrated with an IC structure 200Z, depicted in FIG. 2Z.

The fabrication method 100 leaves several characteristic features in the IC structure 200Z that are indicative of the method 100 being used. One such feature is that the material composition of the top metal line 293 and the via 295 is substantially the same, which is a result of both of the top metal line 293 and the via 295 being formed from the second electrically conductive material 220 deposited in the process 114. A sum of the thickness of the top metal line 293 and the thickness of the via 295 is equal to the thickness 268 of the second electrically conductive material 220 (FIG. 2R). Another characteristic feature indicative of the use of the method 100 is that while there is likely to be a detectable metal grain boundary at the interface between the via 295 and the bottom metal line 263 (as illustrated in FIG. 2Q), there will not be a metal grain boundary at the interface between the via 295 and the top metal line 293 because those are formed of the same material, deposited in a single process. Yet another characteristic feature is that the via 293 will have two portions with different widths (shown as portions 295-1 and 295-2 in FIG. 2Z, where portion 295-2 is shown with a brick pattern): namely, the first portion 295-1 of the via 293 may be the portion that is between the bottom metal line 263 and the second portion 295-2, and the second portion 295-2 may be a portion of the via 295 that is between the first portion 295-1 and the top metal line 293. In some embodiments, the width of the second portion 295-2 (i.e., the dimension measured along the x-axis) may be smaller than the width of the first portion 295-1 by between about 1 and 15 nanometers, including all values and ranges therein, e.g., between about 2 and 12 nanometers, or between about 5 and 10 nanometers. In some embodiments, a height of the first portion 295-1 (e.g., a dimension measured along the z-axis of the example coordinate system shown in FIG. 2Z) may be between about 1 and 15 nanometers, including all values and ranges therein, e.g., between about 2 and 12 nanometers, or between about 5 and 10 nanometers. In some embodiments, a height of the via 295 (e.g., a dimension measured along the z-axis of the example coordinate system shown in FIG. 2Z, in particular—the dimension 268) may be between about 20 and 100 nanometers, including all values and ranges therein, e.g., between about 20 and 65 nanometers, or between about 20 and 50 nanometers.

Yet another feature indicative of the use of the method 100 is that a width of the top metal line 293 (e.g., a dimension measured along the x-axis of the example coordinate system shown in FIG. 2Z) is substantially equal to the width of the second portion 295-2 of the via 295. Furthermore, the first portion 295-1 of the via 295 is substantially aligned with the bottom metal line 263 (i.e., in a cross-sectional side view, a line perpendicular to the support structure 202 and going through the center of the first portion 295-1 of the via 295 may substantially coincide with a line perpendicular to the support structure 202 and going through the center of the bottom metal line 263). On the other hand, the second portion 295-2 of the via 295 may be substantially aligned with the top metal line 293 (i.e., in a cross-sectional side view, a line perpendicular to the support structure 202 and going through the center of the second portion 295-2 of the via 295 may substantially coincide with a line perpendicular to the support structure 202 and going through the center of the top metal line 293).

The method 100 allows forming the via 295 as a self-aligned via, integrated in the BEOL of a metallization stack. The via 295 provides electrical connectivity between the bottom metal line 263 and the top metal line 293 and, advantageously, is self-aligned to both of these metal lines.

It should be noted that the descriptions of the method 100, provided above, are also applicable to embodiments where the bottom metal line 263 is formed as a top metal line for another set of a self-aligned via and bottom and top metal lines. In such embodiments, the processes 102-110, described above, would not be included in the method 100, or, rather, the processes 102-110 would be replaced with the processes 112-120, described above except that the "top metal line" of those processes would now become the bottom metal line 263. The method would then proceed with another iteration of the processes 112-120 to implement the self-aligned via 295 and the top metal line 293, as described herein.

Furthermore, in still further embodiments, the bottom metal line 263 may be formed using processes other than the processes 102-110, described above, all of which embodiments also being within the scope of the present disclosure. In such embodiments, the processes 102-110, described above, would not be included in the method 100, or, rather, the processes 102-110 would be replaced with other processes for providing a metal line as the bottom metal line 263. The method would then proceed with the processes 112-120 to implement the self-aligned via 295 and the top metal line 293, as described herein.

Example Devices

The IC structures with self-aligned vias integrated in the BEOL, disclosed herein, may be included in any suitable electronic device. FIGS. 3-6 illustrate various examples of apparatuses that may include one or more of the IC structures disclosed herein.

Figure 3B:
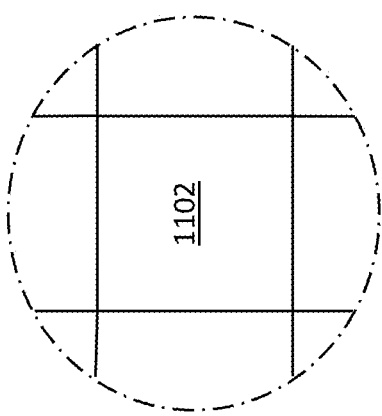
FIGS. 3A and 3B are top views of a wafer and dies that include one or more IC structures with self-aligned vias integrated in the BEOL in accordance with any of the embodiments disclosed herein.
Figure 3A:
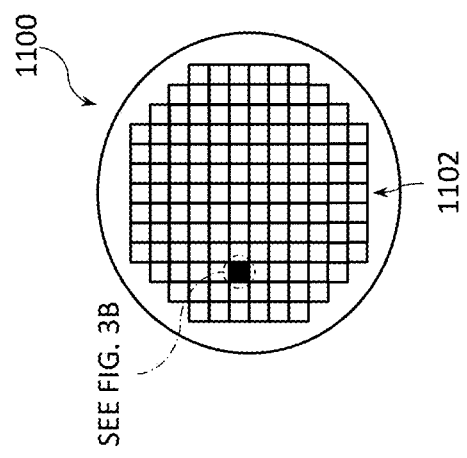

FIGS. 3A and 3B are top views of a wafer and dies that include one or more IC structures with self-aligned vias integrated in the BEOL in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., the IC 200J as shown in FIG. 2J, or any further embodiments of such an IC). After the fabrication of the semiconductor product is complete (e.g., after manufacture of one or more IC structures with self-aligned vias integrated in the BEOL as described herein, included in a particular electronic component, e.g. in a transistor or in a memory device), the wafer 1100 may undergo a singulation process in which each of the dies 1102 is separated from one another to provide discrete "chips" of the semiconductor product. In particular, devices that include a metallization stack as disclosed herein may take the form of the wafer 1100 (e.g., not singulated) or the form of the die 1102 (e.g., singulated). The die 1102 may include one or more transistors (e.g., one or more of the transistors 1240 of FIG. 4, discussed below) and/or supporting circuitry to route electrical signals to the transistors, as well as any other IC components (e.g., one or more of the via contacts formed by the via contact patterning method as discussed herein, which may take the form of any of the metallization stacks described herein). In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 6) or other logic that is configured to store information in the memory devices or execute instructions stored in the memory array.

Figure 4:
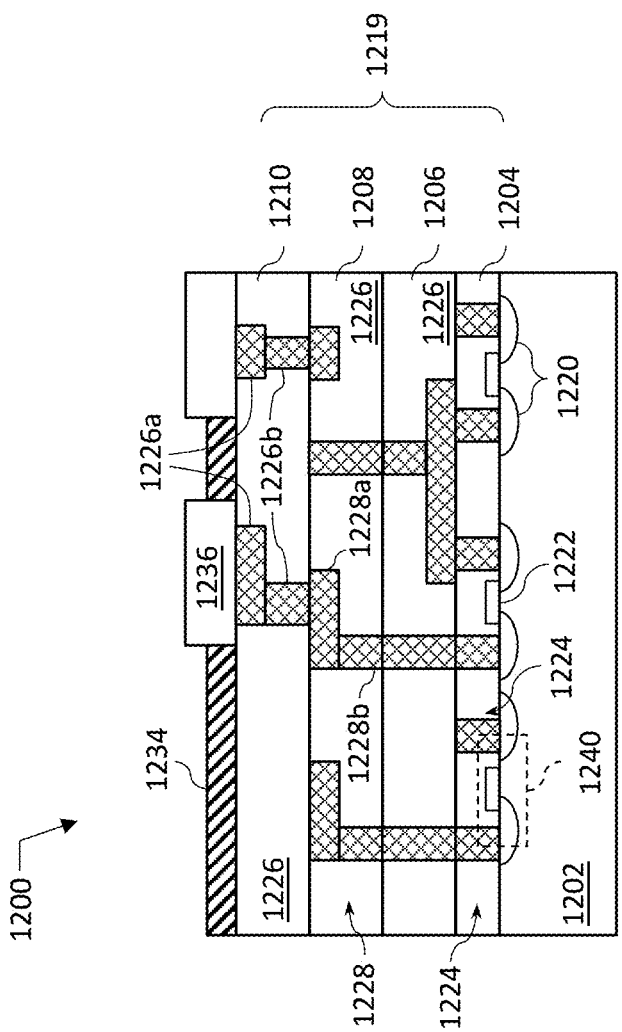
FIG. 4 is a cross-sectional side view of an IC device that may include one or more IC structures with self-aligned vias integrated in the BEOL in accordance with any of the embodiments disclosed herein.

FIG. 4 is a cross-sectional side view of an IC device 1200 that may include one or more IC structures with self-aligned vias integrated in the BEOL in accordance with any of the embodiments disclosed herein. The IC device 1200 may be formed on a substrate 1202 (e.g., the wafer 1100 of FIG. 3A) and may be included in a die (e.g., the die 1102 of FIG. 3B). The substrate 1202 may be any substrate as described herein. The substrate 1202 may be part of a singulated die (e.g., the dies 1102 of FIG. 3B) or a wafer (e.g., the wafer 1100 of FIG. 3A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate electrode layer and a gate dielectric layer.

The gate electrode layer may be formed on the gate interconnect support layer and may include at least one P-type workfunction metal or N-type workfunction metal, depending on whether the transistor is to be a PMOS or an NMOS transistor, respectively. In some implementations, the gate electrode layer may include a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1240 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 4, gate contacts to the gate 1222 may be made as described above with reference to the gate 206 and gate via contacts formed by the via contact patterning method described herein.

The S/D regions 1220 may be formed within the substrate 1202 adjacent to the gate 1222 of each transistor 1240, using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220. In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 4 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1410 may form an ILD stack 1219 of the IC device 1200. In general, embodiments of the present disclosure may be used for any interconnect layer.

Figure 5:
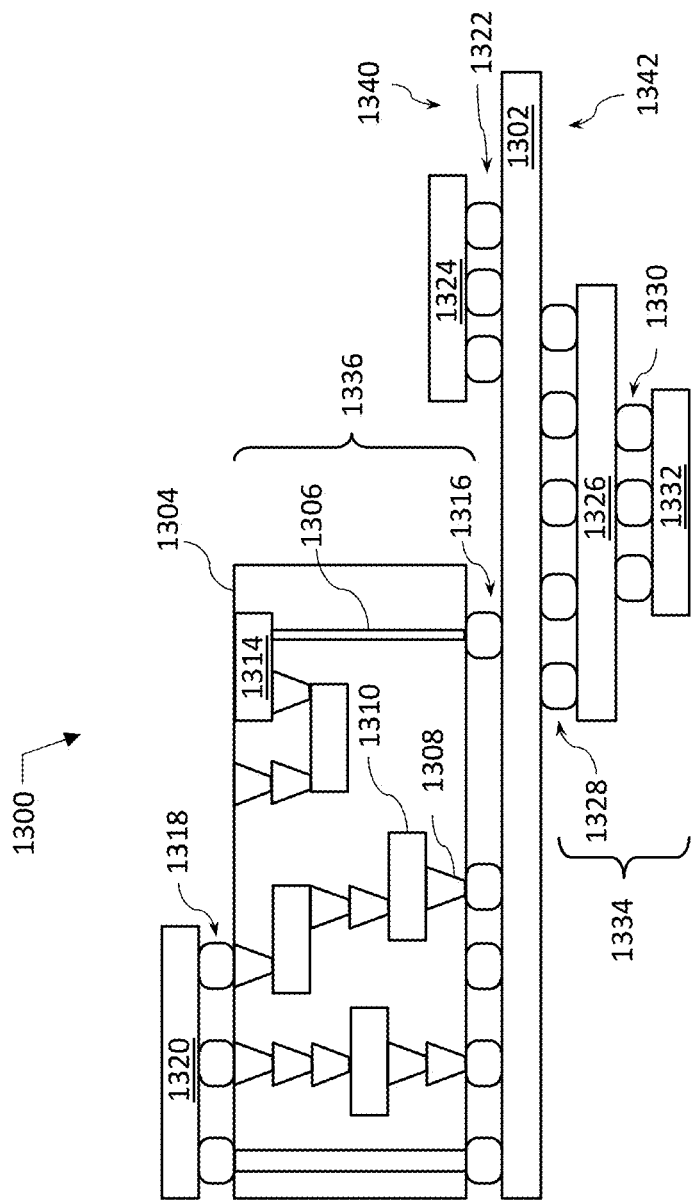
FIG. 5 is a cross-sectional side view of an IC device assembly that may include one or more IC structures with self-aligned vias integrated in the BEOL in accordance with any of the embodiments disclosed herein.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 5). Although a particular number of interconnect layers 1206-1210 is depicted in FIG. 5, embodiments of the present disclosure include IC devices having more or fewer interconnect layers than depicted.

In some embodiments, the interconnect structures 1228 may include trench contact structures 1228a (sometimes referred to as "lines") and/or via structures 1228b (sometimes referred to as "holes") filled with an electrically conductive material such as a metal. The trench contact structures 1228a may be arranged to route electrical signals in a direction of a plane that is substantially parallel with a surface of the substrate 1202 upon which the device layer 1204 is formed. For example, the trench contact structures 1228a may route electrical signals in a direction in and out of the page from the perspective of FIG. 4. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench contact structures 1228a of different interconnect layers 1206-1210 together.

The interconnect layers 1206-1210 may include a dielectric material 1226 disposed between the interconnect structures 1228, as shown in FIG. 4. The dielectric material 1226 may take the form of any of the embodiments of the dielectric material provided between the interconnects of the IC structures disclosed herein, for example any of the embodiments discussed herein with reference to the dielectric materials 204 or 208, described herein.

In some embodiments, the dielectric material 1226 disposed between the interconnect structures 1228 in different ones of the interconnect layers 1206-1210 may have different compositions. In other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench contact structures 1228a and/or via structures 1228b, as shown. The trench contact structures 1228a of the first interconnect layer 1206 may be coupled with contacts (e.g., the S/D contacts 1224) of the device layer 1204. In some embodiments, the via structures 1228b may be implemented as the self-aligned via integrated in the BEOL, e.g., as the via 295 formed using the method 100, described above. In such embodiments, the trench contact structures 1228a may be implemented as the top metal line described herein, e.g., as the top metal line 293 formed using the method 100, described above.

A second interconnect layer 1208 (referred to as Metal 2 or "M2") may be formed directly on the first interconnect layer 1206. In some embodiments, the second interconnect layer 1208 may include via structures 1228b to couple the trench contact structures 1228a of the second interconnect layer 1208 with the trench contact structures 1228a of the first interconnect layer 1206. Although the trench contact structures 1228a and the via structures 1228b are structurally delineated with a line within each interconnect layer (e.g., within the second interconnect layer 1208) for the sake of clarity, the trench contact structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206. As shown in FIG. 4, the third interconnect layer 1210 may include one or more trench structures 1226a and one or more via structures 1226b. In some embodiments, the via structures 1226b may be implemented as the self-aligned via integrated in the BEOL, e.g., as the via 295 formed using the method 100, described above. In such embodiments, the trench contact structures 1226a may be implemented as the top metal line described herein, e.g., as the top metal line 293 formed using the method 100, described above. Furthermore, in such embodiments, the trench contact structures 1228a may be implemented as the bottom metal line described herein, e.g., as the bottom metal line 263 formed using the method 100, described above.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

FIG. 5 is a cross-sectional side view of an IC device assembly 1300 that may include components having or being associated with (e.g. being electrically connected by means of) one or more IC structures with self-aligned vias integrated in the BEOL in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the metallization stacks 100 disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 5 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 5), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 5, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 3B), an IC device (e.g., the IC device 1200 of FIG. 4), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 5, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 5 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 6:
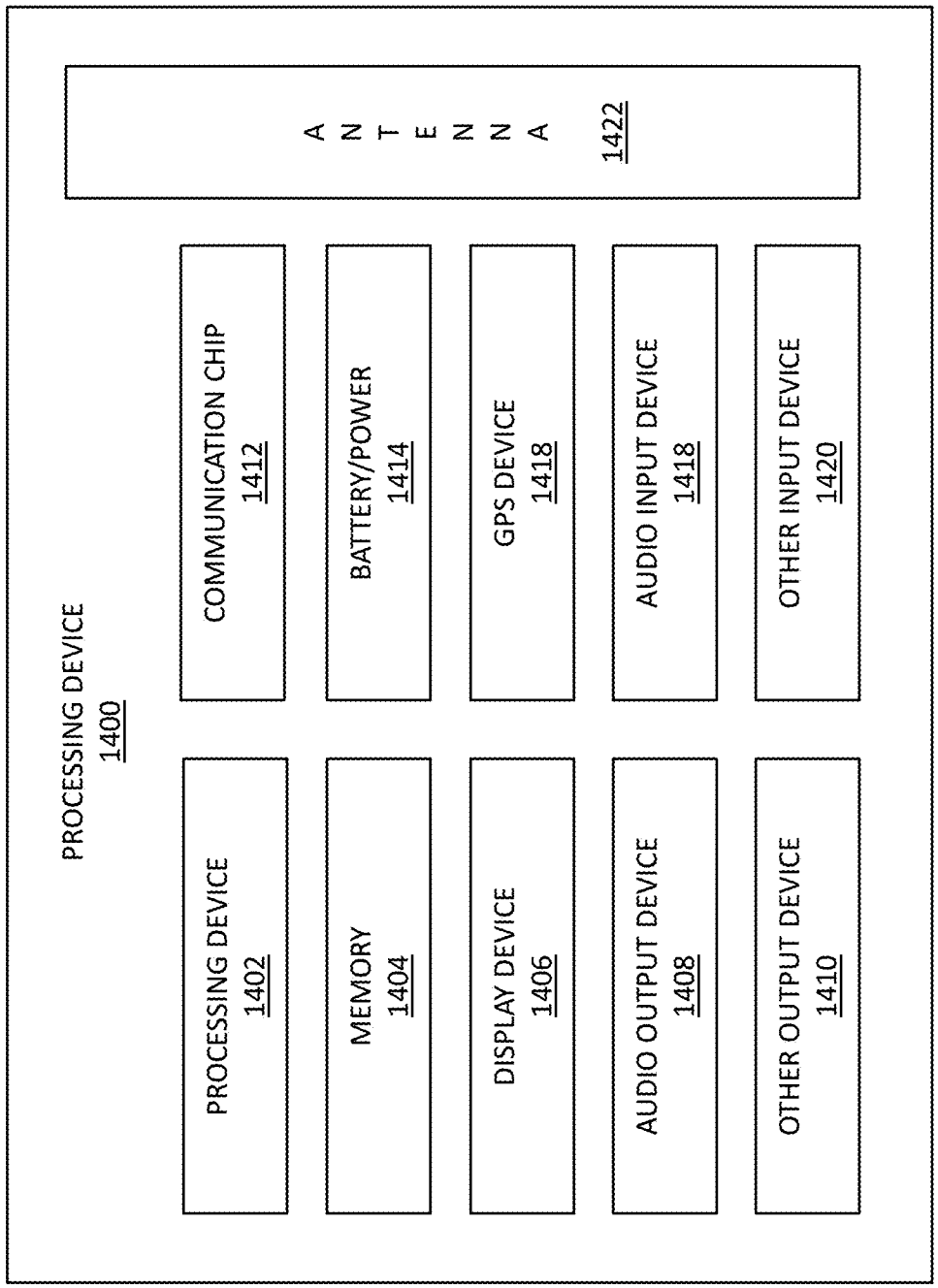
FIG. 6 is a block diagram of an example computing device that may include one or more IC structures with self-aligned vias integrated in the BEOL in accordance with any of the embodiments disclosed herein.

FIG. 6 is a block diagram of an example computing device 1400 that may include one or more components including one or more IC structures with self-aligned vias integrated in the BEOL in accordance with any of the embodiments disclosed herein. For example, any suitable ones of the components of the computing device 1400 may include a die (e.g., the die 1102 of FIG. 3B) having one or more IC structures with self-aligned vias integrated in the BEOL as described herein. Any one or more of the components of the computing device 1400 may include, or be included in, an IC device 1200 (FIG. 4). Any one or more of the components of the computing device 1400 may include, or be included in, an IC device assembly 1300 (FIG. 5).

A number of components are illustrated in FIG. 6 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 6, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-M RAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

SELECT EXAMPLES

The following paragraphs provide various examples of the embodiments disclosed herein.

Example 1 provides am IC structure that includes a support structure (e.g., a substrate); a first electrically conductive structure (e.g., a bottom metal line), provided over the support structure; a via, provided over the first electrically conductive structure; and a second electrically conductive structure (e.g., a top metal line), provided over the via, where the via is configured to provide electrical connectivity between the first electrically conductive structure and the second electrically conductive structure, the via has a first portion and a second portion, the first portion is a portion of the via that is between the first electrically conductive structure and the second portion, the second portion is a portion of the via that is between the first portion and the second electrically conductive structure, and, in a cross-sectional side view, a width of the second portion (e.g., a dimension measured along the x-axis of the example coordinate system shown in FIG. 2) is smaller than a width of the first portion.

Example 2 provides the IC structure according to example 1, where the width of the second portion is smaller than the width of the first portion by between about 1 and 15 nanometers, including all values and ranges therein, e.g., between about 2 and 12 nanometers, or between about 5 and 10 nanometers.

Example 3 provides the IC structure according to examples 1 or 2, where a height of the first portion (e.g., a dimension measured along the z-axis of the example coordinate system shown in FIG. 2) is between about 1 and 15 nanometers, including all values and ranges therein, e.g., between about 2 and 12 nanometers, or between about 5 and 10 nanometers.

Example 4 provides the IC structure according to any one of the preceding examples, where a height of the via (e.g., a dimension measured along the z-axis of the example coordinate system shown in FIG. 2) is between about 20 and 100 nanometers, including all values and ranges therein, e.g., between about 20 and 65 nanometers, or between about 20 and 50 nanometers.

Example 5 provides the IC structure according to any one of the preceding examples, where a width of the first electrically conductive structure (e.g., a dimension measured along the y-axis of the example coordinate system shown in FIG. 2) is substantially equal to the width of the first portion of the via.

Example 6 provides the IC structure according to any one of the preceding examples, where a width of the second electrically conductive structure (e.g., a dimension measured along the x-axis of the example coordinate system shown in FIG. 2) is substantially equal to the width of the second portion of the via.

Example 7 provides the IC structure according to any one of the preceding examples, where the first portion of the via is substantially aligned with the first electrically conductive structure (i.e., in a cross-sectional side view, a line perpendicular to the support structure and going through the center of the first portion of the via substantially coincides with a line perpendicular to the support structure and going through the center of the first electrically conductive structure).

Example 8 provides the IC structure according to any one of the preceding examples, where the second portion of the via is substantially aligned with the second electrically conductive structure (i.e., in a cross-sectional side view, a line perpendicular to the support structure and going through the center of the second portion of the via substantially coincides with a line perpendicular to the support structure and going through the center of the second electrically conductive structure).

Example 9 provides the IC structure according to any one of the preceding examples, where the first portion of the via is in contact with the first electrically conductive structure.

Example 10 provides the IC structure according to any one of the preceding examples, where the second portion of the via is in contact with the second electrically conductive structure.

Example 11 provides the IC structure according to any one of the preceding examples, where a material composition of the via is substantially the same as a material composition of the second electrically conductive structure.

Example 12 provides the IC structure according to any one of the preceding examples, where a material composition of the via is different from a material composition of the first electrically conductive structure.

Example 13 provides the IC structure according to any one of the preceding examples, where at least the via and the second electrically conductive structure are in a back end of line (BEOL) portion of the IC structure, and the IC structure further includes a plurality of semiconductor devices in a front end of line (FEOL) portion of the IC structure, where the FEOL portion is between the support structure and the BEOL.

Example 14 provides an IC package that includes an IC die having a first metal line, a via, and a second metal line stacked over one another over the IC die, where each of the first metal line and the second metal line extend in a direction parallel to the IC die, the via extends in a direction perpendicular to the IC die and has a first portion electrically connected to the first metal line and a second portion electrically connected to the first metal line, and a width of the second portion is smaller than a width of the first portion. The IC package also includes a further IC component, coupled to the IC die.

Example 15 provides the IC package according to example 14, where the further component is one of a package substrate, a flexible substrate, or an interposer.

Example 16 provides the IC package according to examples 14 or 15, where the further component is coupled to the IC die via one or more first level interconnects.

Example 17 provides the IC package according to example 16, where the one or more first level interconnects include one or more solder bumps, solder posts, or bond wires.

Example 18 provides a method of forming an IC structure. The method includes providing a first electrically conductive structure (e.g., a bottom metal line) over a support structure (e.g., a substrate); providing a via over the first electrically conductive structure; and providing a second electrically conductive structure (e.g., a top metal line) over the via, where the via has a first portion and a second portion, the first portion is a portion of the via that is between the first electrically conductive structure and the second portion, the second portion is a portion of the via that is between the first portion and the second electrically conductive structure, and, in a cross-sectional side view, a width of the second portion (e.g., a dimension measured along the x-axis of the example coordinate system shown in FIG. 2) is smaller than a width of the first portion.

Example 19 provides the method according to example 18, where providing the first electrically conductive structure includes: providing a stack of a bottom dielectric material, a first electrically conductive material, a top dielectric material and a sacrificial material; patterning the sacrificial material to form an opening that defines a shape and a location of the first electrically conductive structure; patterning the top dielectric material through the opening that defines the shape and the location of the first electrically conductive structure to form an opening that defines a shape and a location of the via; filling the opening that defines the shape and the location of the first electrically conductive structure and the opening that defines the shape and the location of the via with an etch block material; and sequentially performing selective etches to remove portions of each of the sacrificial material, the top dielectric material, and the first electrically conductive material using the etch block material as an etch block.

Example 20 provides the method according to example 19, where patterning the top dielectric material through the opening that defines the shape and the location of the first electrically conductive structure to form the opening that defines the shape and the location of the via includes: performing lithographic patterning to define an opening in a mask material that is provided over the opening that defines the shape and the location of the first electrically conductive structure, where the opening in the mask material overlaps with the opening that defines the shape and the location of the first electrically conductive structure, and performing selective etch through the opening in the mask material to remove a portion of the top dielectric material exposed by the opening in the mask material without substantially removing a portion of the sacrificial material exposed by the opening in the mask material.

Example 21 provides a computing device that includes a circuit board; and an IC die coupled to the circuit board, where the IC die includes one or more of: one or more IC structures according to any one of the preceding examples (e.g., each IC structure may be an IC structure according to any one of examples 1-13 and/or may be formed according to a method of any one of examples 18-20), one or more of IC packages according to any one of the preceding examples (e.g., each IC package may be an IC package according to any one of examples 14-17).

Example 22 provides the computing device according to example 21, where the computing device is a wearable computing device (e.g., a smart watch) or handheld computing device (e.g., a mobile phone).

Example 23 provides the computing device according to examples 21 or 22, where the computing device is a server processor.

Example 24 provides the computing device according to examples 21 or 22, where the computing device is a motherboard.

Example 25 provides the computing device according to any one of examples 21-24, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a support;
a first conductive line over the support, the first conductive line having a longitudinal axis along a first direction parallel to the support;
a via over the first conductive line; and
a second conductive line over the via, the second conductive line having a longitudinal axis along a second direction parallel to the support and perpendicular to the first direction,
wherein:
the via has a first portion and a second portion, the first portion is between the first conductive line and the second portion, the second portion is between the first portion and the second conductive line, and a width of the second portion along the first direction is smaller than a width of the first portion along the first direction,
a first sidewall of the first conductive line is aligned with a first sidewall of the first portion, and
a second sidewall of the first conductive line is aligned with a second sidewall of the first portion.

2. The IC structure according to claim 1, wherein the width of the second portion along the first direction is smaller than the width of the first portion along the first direction by between 1 and 15 nanometers.

3. The IC structure according to claim 1, wherein a height of the first portion is between 1 and 15 nanometers.

4. The IC structure according to claim 1, wherein a height of the via is between 20 and 100 nanometers.

5. The IC structure according to claim 1, wherein a width of the first conductive line along the second direction is substantially equal to a width of the first portion along the second direction.

6. The IC structure according to claim 1, wherein a width of the second conductive line along the first direction is substantially equal to the width of the second portion along the first direction.

7. The IC structure according to claim 1, wherein the first sidewall of the first conductive line and the first sidewall of the first portion extend along a first plane parallel to the first direction, and the second sidewall of the first conductive line and the second sidewall of the first portion extend along a second plane parallel to the first direction.

8. The IC structure according to claim 1, wherein:
a first sidewall of the second conductive line is aligned with a first sidewall of the second portion, and
a second sidewall of the second conductive line is aligned with a second sidewall of the second portion.

9. The IC structure according to claim 1, wherein the first sidewall of the second conductive line and the first sidewall of the second portion extend along a first plane parallel to the second direction, and the second sidewall of the second conductive line and the second sidewall of the second portion extend along a second plane parallel to the second direction.

10. The IC structure according to claim 1, wherein the first portion is in contact with the first conductive line or the second portion is in contact with the second conductive line.

11. The IC structure according to claim 1, wherein a material composition of the via is substantially same as a material composition of the second conductive line.

12. The IC structure according to claim 11, wherein a material composition of the via is different from a material composition of the first conductive line.

13. The IC structure according to claim 1, wherein:
at least the via and the second conductive line are in a back end of line (BEOL) portion of the IC structure, the IC structure further includes a plurality of semiconductor devices in a front end of line (FEOL) portion of the IC structure, where the FEOL portion is between the support and the BEOL.

14. An integrated circuit (IC) package, comprising:
an IC die having a first conductive line extending along a first direction parallel to the IC die, a via over the first conductive line, and a second conductive line over the via and extending along a second direction parallel to the IC die; and
a further IC component, coupled to the IC die,
wherein:
the via has a first portion and a second portion, the first portion is between the first conductive line and the second portion, the second portion is between the first portion and the second conductive line, and a width of the second portion along the first direction is smaller than a width of the first portion along the first direction,
a first sidewall of the second conductive line is aligned with a first sidewall of the second portion, and
a second sidewall of the second conductive line is aligned with a second sidewall of the second portion.

15. The IC package according to claim 14, wherein the further component is one of a package substrate, a flexible substrate, or an interposer.

16. The IC package according to claim 14, wherein the further component is coupled to the IC die via one or more first level interconnects.

17. The IC package according to claim 16, wherein the one or more first level interconnects include one or more solder bumps, solder posts, or bond wires.

18. A method of forming an integrated circuit (IC) structure, the method comprising:
providing a stack of a first insulator material, a first conductive material, a second insulator material, and a sacrificial material;
patterning the sacrificial material to form an opening for a first conductive line;
patterning the second insulator material through the opening for the first conductive line to form an opening for a via,
filling the opening for the first conductive line and the opening for the via with a further material, and
removing portions of the sacrificial material and the second insulator material that are not covered by the further material,
removing portions of the first conductive material that are not covered by the further material to form the first conductive line;
providing the via over the first conductive line; and
providing a second conductive line over the via, where:
the via has a first portion and a second portion, the first portion is between the first conductive line and the second portion, the second portion is between the first portion and the second conductive line, and a width of the second portion is smaller than a width of the first portion.

19. The method according to claim 18, wherein removing the portions of the sacrificial material and the second insulator material that are not covered by the further material, and removing the portions of the first conductive material that are not covered by the further material includes:
sequentially performing selective etches to remove the portions of the sacrificial material that are not covered by the further material, remove the portions of the second insulator material that are not covered by the further material, and remove the portions of the first conductive material that are not covered by the further material.

20. The method according to claim 19, wherein patterning the second insulator material through the opening or the first conductive line to form the opening or the via includes:
performing lithographic patterning to define an opening in a mask material over the opening or the first conductive line, wherein the opening in the mask material overlaps with the opening or the first conductive line, and
performing a selective etch through the opening in the mask material to remove a portion of the second insulator material exposed by the opening in the mask material.

* * * * *

UNITED STATES PATENT AND TRADEMARK OFFICE
CERTIFICATE OF CORRECTION

| | | |
|---|---|---|
| PATENT NO. | : 11,916,010 B2 | Page 1 of 1 |
| APPLICATION NO. | : 16/880744 | |
| DATED | : February 27, 2024 | |
| INVENTOR(S) | : Guillaume Bouche et al. | |

It is certified that error appears in the above-identified patent and that said Letters Patent is hereby corrected as shown below:

On the Title Page

On Page 2, item (56), under "OTHER PUBLICATIONS" in Column 2, Line 12, delete "teh" and insert -- the --, therefor.

In the Claims

In Column 30, Claim 20, Line 31, delete "or the" and insert -- for the --, therefor.

In Column 30, Claim 20, Line 32, delete "or the" and insert -- for the --, therefor.

In Column 30, Claim 20, Line 34, delete "or the" and insert -- for the --, therefor.

In Column 30, Claim 20, Line 36, delete "or the" and insert -- for the --, therefor.

Signed and Sealed this
Second Day of April, 2024

*Katherine Kelly Vidal*

Katherine Kelly Vidal
*Director of the United States Patent and Trademark Office*